(12) United States Patent
Hu et al.

(10) Patent No.: US 12,527,046 B2
(45) Date of Patent: Jan. 13, 2026

(54) HIGH ELECTRON MOBILITY TRANSISTOR SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Kai Hu, Suzhou (CN); King Yuen Wong, Suzhou (CN); Chaodong Ye, Suzhou (CN); Jinhan Zhang, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 606 days.

(21) Appl. No.: 17/295,461

(22) PCT Filed: Apr. 12, 2021

(86) PCT No.: PCT/CN2021/086656
§ 371 (c)(1),
(2) Date: May 20, 2021

(87) PCT Pub. No.: WO2022/217435
PCT Pub. Date: Oct. 20, 2022

(65) Prior Publication Data
US 2022/0376042 A1 Nov. 24, 2022

(51) Int. Cl.
*H10D 62/10* (2025.01)
*H01L 21/265* (2006.01)
(Continued)

(52) U.S. Cl.
CPC ....... *H10D 62/113* (2025.01); *H01L 21/2654* (2013.01); *H01L 21/266* (2013.01);
(Continued)

(58) Field of Classification Search
None
See application file for complete search history.

(56) References Cited

U.S. PATENT DOCUMENTS

2010/0052014 A1* 3/2010 Matsushita .......... H10D 64/411
438/285
2011/0248330 A1 10/2011 Yaegashi et al.
(Continued)

FOREIGN PATENT DOCUMENTS

| CN | 101022128 A | 8/2007 |
|---|---|---|
| CN | 103545360 A | 1/2014 |

(Continued)

OTHER PUBLICATIONS

First Office Action of the corresponding China patent application No. 202180001601.2 mailed on Dec. 14, 2021.
(Continued)

*Primary Examiner* — Sue A Purvis
*Assistant Examiner* — Seyon Ali-Simah Punchbeddell
(74) *Attorney, Agent, or Firm* — JCIPRNET

(57) ABSTRACT

A nitride-based semiconductor device includes first and second nitride-based semiconductor layers, first electrodes, doped nitride-based semiconductor layers, a second electrode, and gate electrodes. The second nitride-based semiconductor layer is disposed on the first nitride-based semiconductor layer. The first and second nitride-based semiconductor layers collectively have an active portion and an electrically isolating portion surrounding the active portion. The first electrodes are disposed over the second nitride-based semiconductor layer. The first electrodes, doped nitride-based semiconductor layers, the gate electrode, and the second electrode are disposed over the second nitride-based semiconductor layer. Each of the doped nitride-based semiconductor layers has a side surface facing
(Continued)

away from the second electrode and spaced apart from the interface.

19 Claims, 17 Drawing Sheets

(51) Int. Cl.
*H01L 21/266* (2006.01)
*H10D 30/01* (2025.01)
*H10D 30/47* (2025.01)
*H10D 62/824* (2025.01)
*H10D 62/85* (2025.01)

(52) U.S. Cl.
CPC ......... *H10D 30/015* (2025.01); *H10D 30/475* (2025.01); *H10D 62/824* (2025.01); *H10D 62/8503* (2025.01)

(56) References Cited

U.S. PATENT DOCUMENTS

| 2013/0122669 | A1 | 5/2013 | Koyama et al. | |
| 2020/0091332 | A1* | 3/2020 | Hata | H01L 29/802 |
| 2020/0111877 | A1* | 4/2020 | Hata | H10D 30/015 |
| 2020/0350399 | A1* | 11/2020 | Wong | H10D 62/343 |
| 2020/0381422 | A1* | 12/2020 | Otake | H01L 29/41741 |
| 2021/0083085 | A1* | 3/2021 | Chang | H01L 27/0605 |
| 2021/0265494 | A1* | 8/2021 | Miyajima | H01L 29/0619 |

FOREIGN PATENT DOCUMENTS

| CN | 104992967 | A | | 10/2015 | |
| CN | 109952634 | A | | 6/2019 | |
| CN | 110071173 | A | * | 7/2019 | ....... H01L 21/02488 |
| CN | 111370300 | A | | 7/2020 | |
| CN | 111937156 | A | | 11/2020 | |
| CN | 112331719 | A | | 2/2021 | |
| CN | 112447834 | A | | 3/2021 | |
| WO | 2016113468 | A1 | | 7/2016 | |

OTHER PUBLICATIONS

International Search Report and Written Opinion of the corresponding PCT application No. PCT/CN2021/086656 mailed on Jan. 17, 2022.
Notice of Allowance of the corresponding China patent application No. 202180001601.2 mailed on Mar. 2, 2022.

* cited by examiner

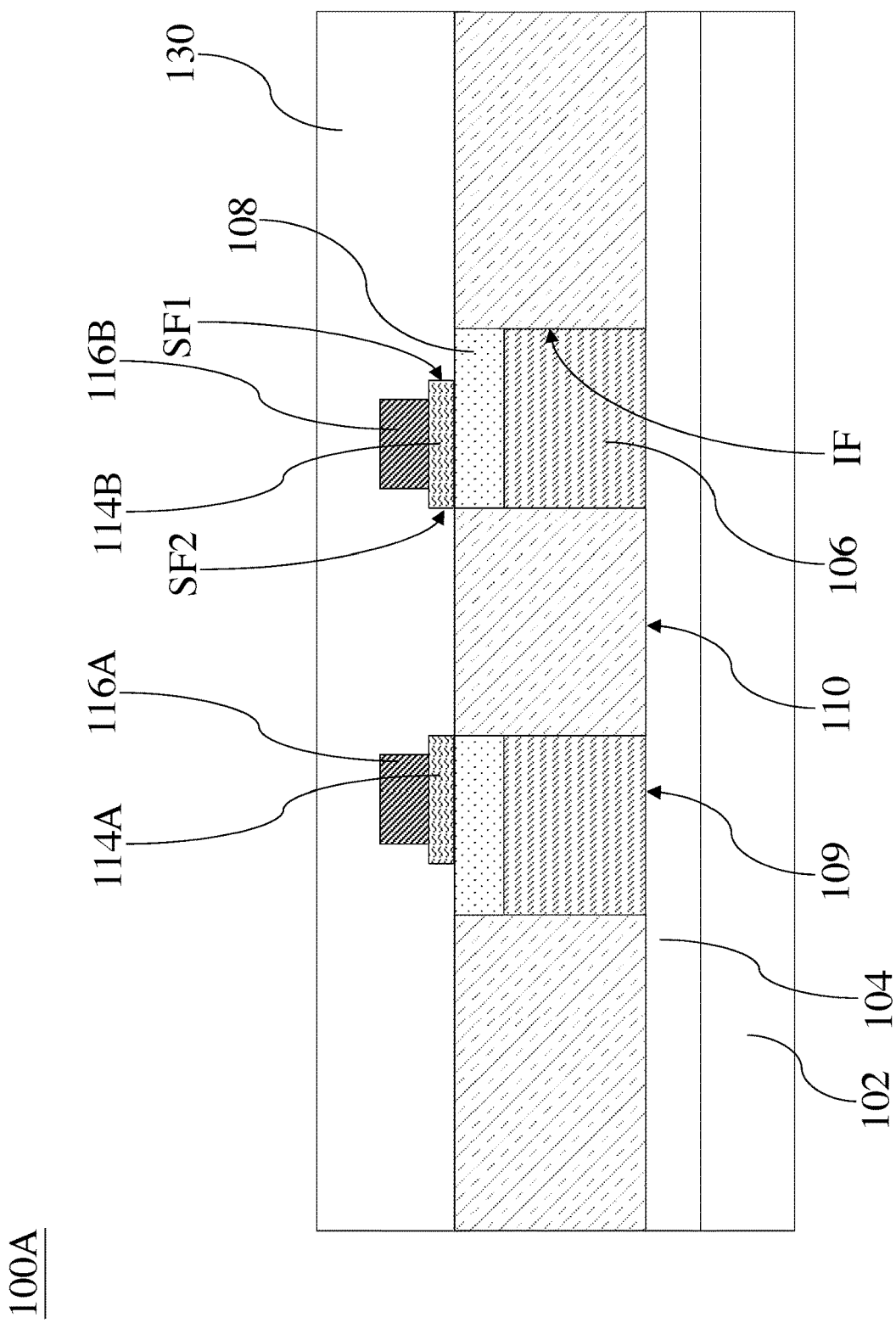

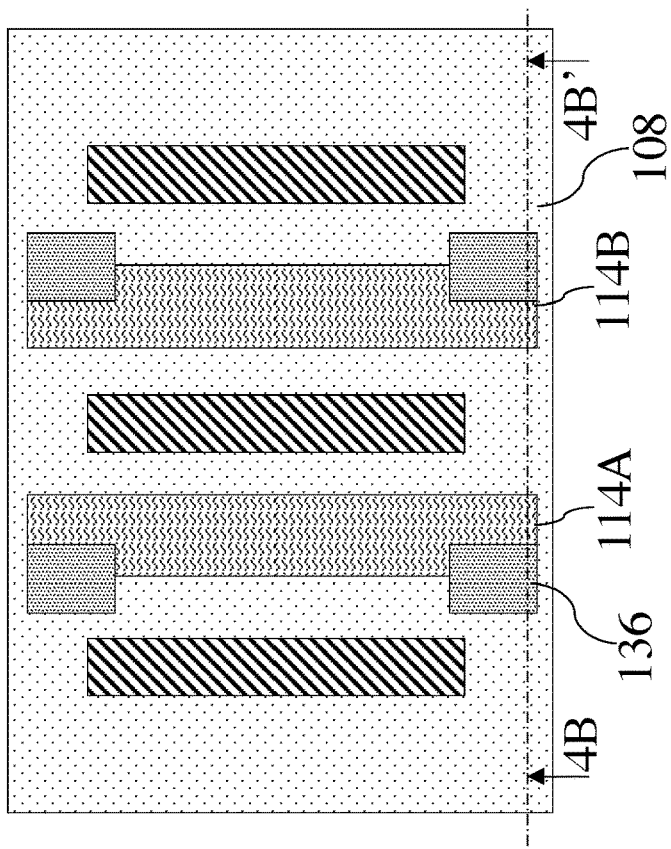
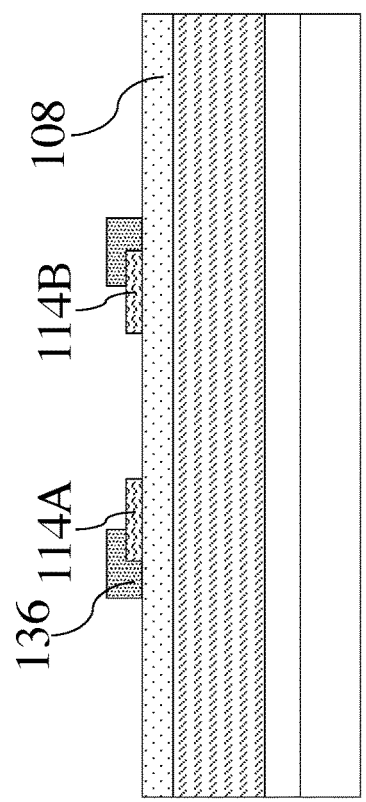
FIG. 3A
FIG. 3B
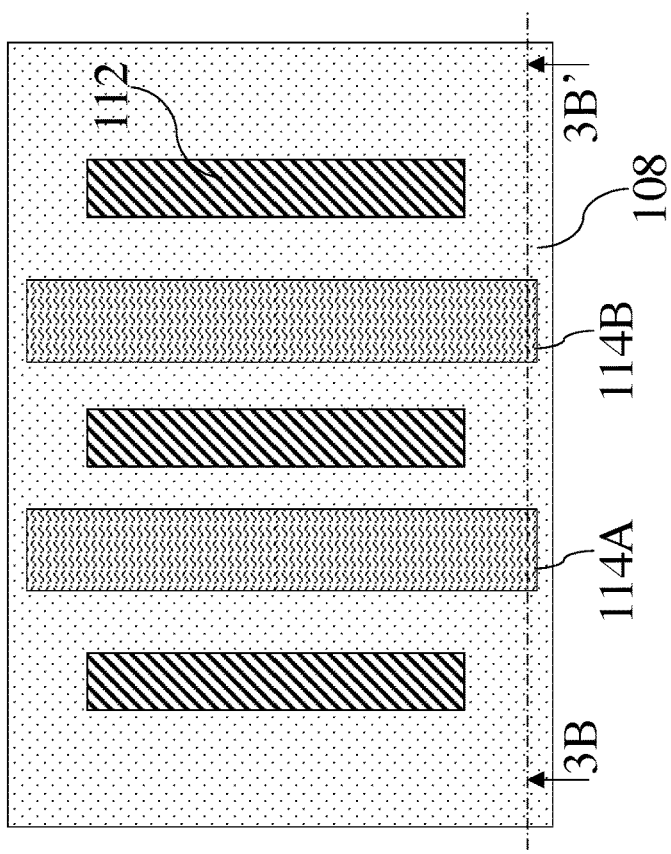
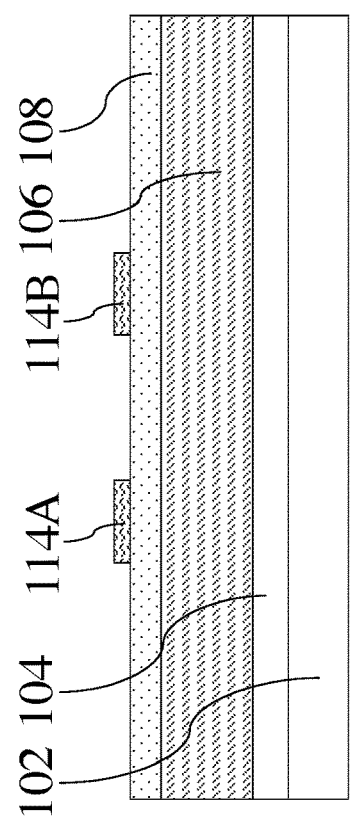
FIG. 4A
FIG. 4B

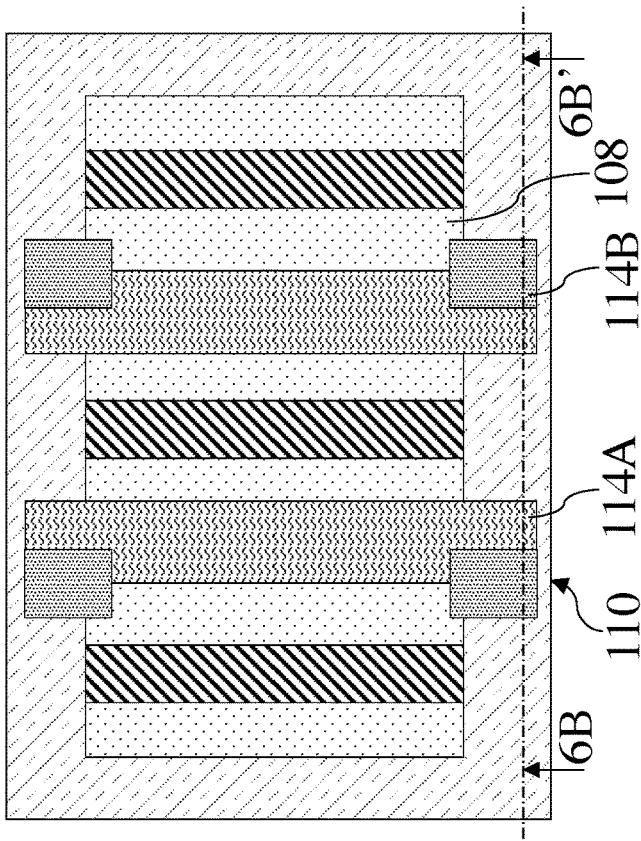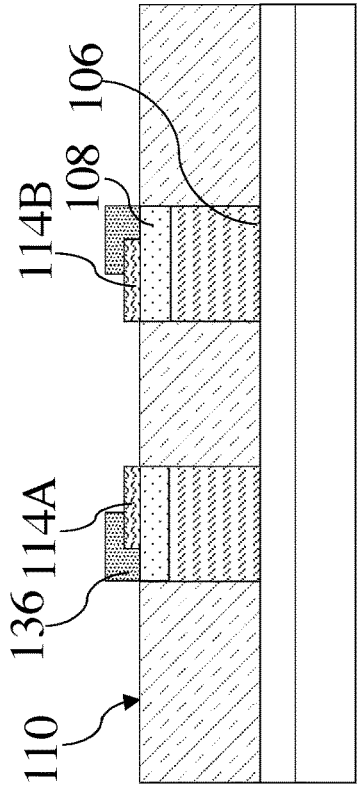
FIG. 5A
FIG. 5B
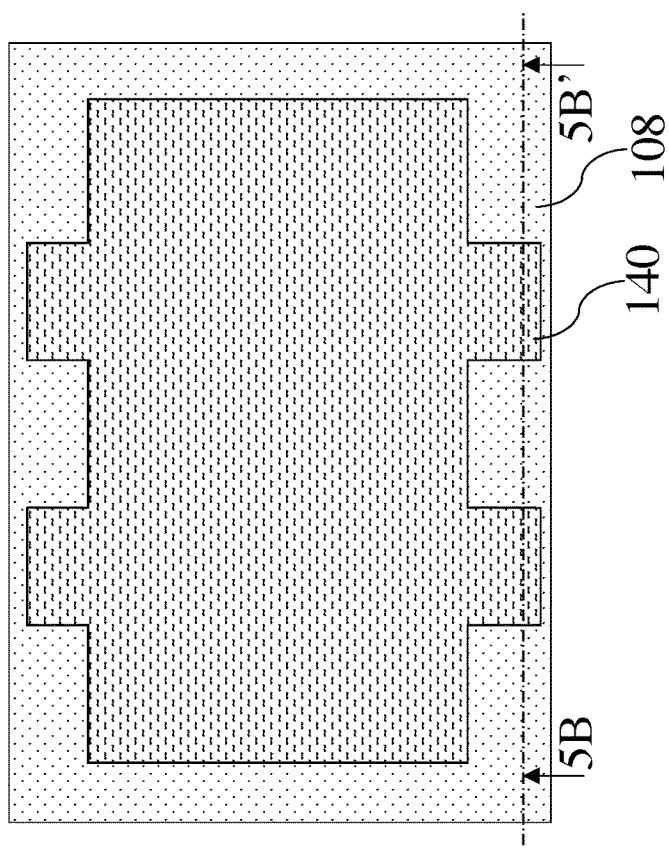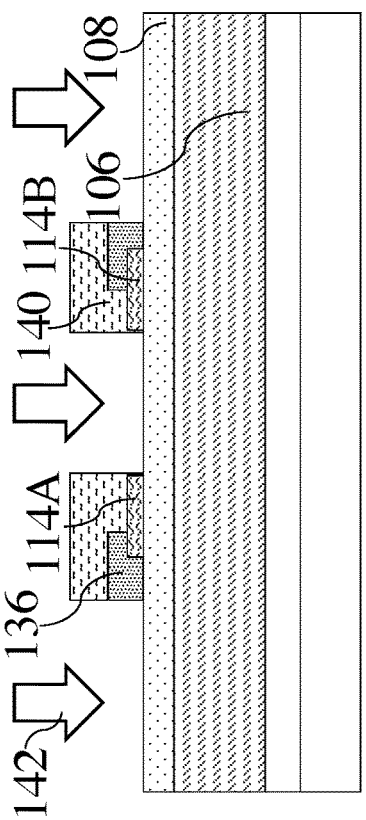
FIG. 6A
FIG. 6B

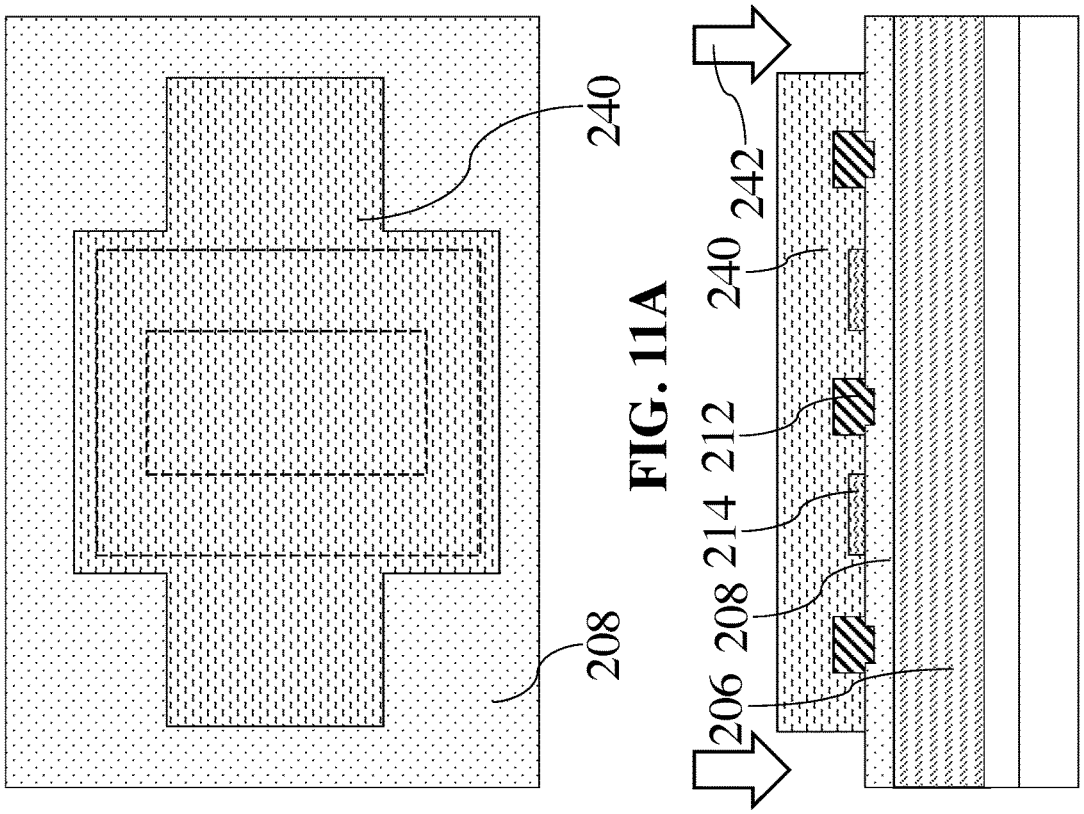
FIG. 11A
FIG. 11B
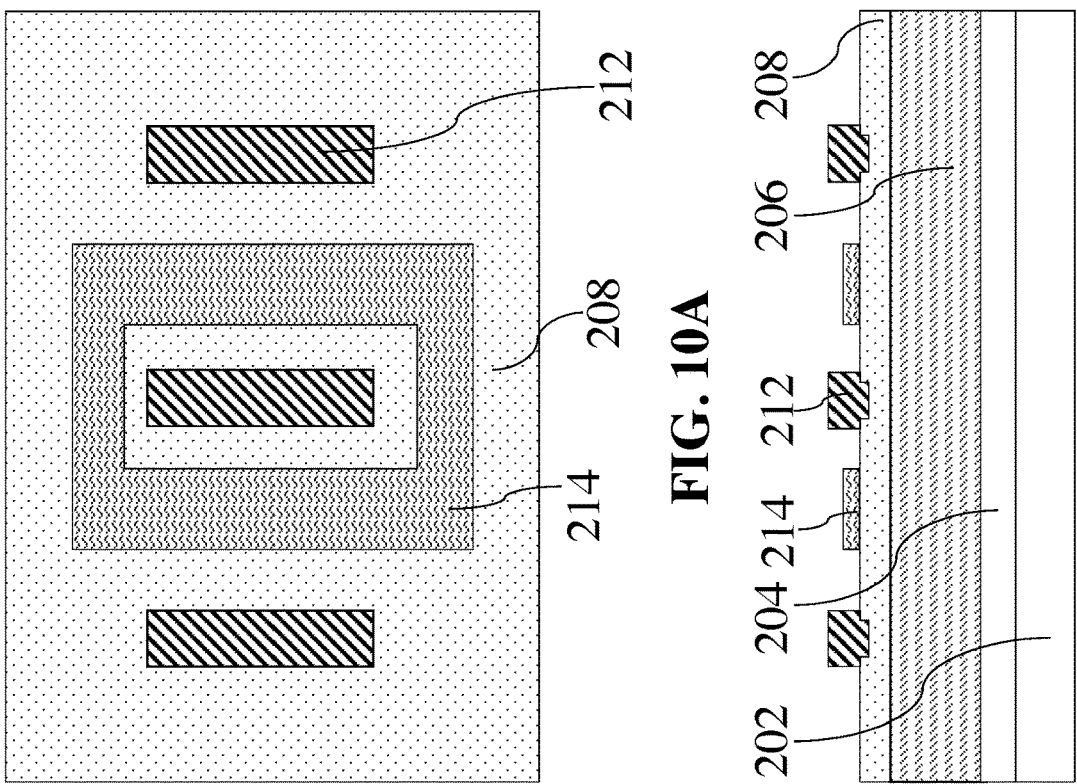
FIG. 10A
FIG. 10B

HIGH ELECTRON MOBILITY TRANSISTOR SEMICONDUCTOR DEVICE AND METHOD FOR MANUFACTURING THE SAME

FIELD OF THE INVENTION

The present invention generally relates to a semiconductor device. More specifically, the present invention relates to a high electron mobility transistor (HEMT) semiconductor device having an electrically isolating portion which is spaced apart from a side surface of doped nitride-based semiconductor layer, thereby improving the performance of the HEMT.

BACKGROUND OF THE INVENTION

In recent years, intense research on high-electron-mobility transistors (HEMTs) has been prevalent, particularly for high power switching and high frequency applications. The HEMT utilizes a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). At present, there is a need to improve the yield rate for HEMT devices, thereby making them suitable for mass production.

SUMMARY OF THE INVENTION

In accordance with one aspect of the present disclosure, a nitride-based semiconductor device is provided. The nitride-based semiconductor device includes a first nitride-based semiconductor layer, a second nitride-based semiconductor layer, a pair of first electrodes, a pair of doped nitride-based semiconductor layers, a second electrode, a pair of gate electrodes. The second nitride-based semiconductor layer is disposed on the first nitride-based semiconductor layer and has a bandgap greater than a bandgap of the first nitride-based semiconductor layer. The first and second nitride-based semiconductor layers collectively have an active portion and an electrically isolating portion that is non-semi-conducting and surrounds the active portion to form an interface. The first electrodes are disposed over the second nitride-based semiconductor layer. The doped nitride-based semiconductor layers are disposed over the second nitride-based semiconductor layer and between the first electrodes, in which the doped nitride-based semiconductor layers are separated from each other. The second electrode is disposed over the second nitride-based semiconductor layer and between the doped nitride-based semiconductor layers, in which each of the doped nitride-based semiconductor layers has a first side surface facing away from the second electrode and spaced apart from the interface. The gate electrodes are disposed over the doped nitride-based semiconductor layers, respectively.

In accordance with one aspect of the present disclosure, a manufacturing method of a semiconductor device is provided. The method includes steps as follows. A first nitride-based semiconductor layer is formed. A second nitride-based semiconductor layer is formed on the first nitride-based semiconductor layer. A plurality of first conductive strips are formed over the second nitride-based semiconductor layer. A pair of doped nitride-based semiconductor strips are formed over the second nitride-based semiconductor layer such that at least one of the first conductive strips is between the doped nitride-based semiconductor strips. A mask layer is formed over the second nitride-based semiconductor layer, the first conductive strips, and the doped nitride-based semiconductor strips such that each of the doped nitride-based semiconductor strips has a side surface entirely covered with the mask layer, in which a region of the second nitride-based semiconductor layer is exposed from the mask layer. An ion implantation process is performed on the first and second nitride-based semiconductor layers such that the first and second nitride-based semiconductor layers collectively have an electrically isolating portion directly under the exposed region of the second nitride-based semiconductor layer.

In accordance with one aspect of the present disclosure, a nitride-based semiconductor device is provided. A semiconductor device includes a first nitride-based semiconductor layer, a second nitride-based semiconductor layer, a plurality of first conductive strips, a pair of doped nitride-based semiconductor strips, and a pair of second conductive strips. A second nitride-based semiconductor layer is disposed on the first nitride-based semiconductor layer and has a bandgap greater than a bandgap of the first nitride-based semiconductor layer. The first and second nitride-based semiconductor layers collectively have an active portion and an electrically isolating portion that is non-semi-conducting and surrounds the active portion to form an interface, and the electrically isolating portion has at least one concave with a first width to receive the active portion. The first conductive strips are disposed over the first nitride-based semiconductor layer, in which the first conductive strips extend along a first direction and are arranged along a second direction different than the first direction. The doped nitride-based semiconductor strips are disposed over the second nitride-based semiconductor layer. The doped nitride-based semiconductor strips extend along the first direction and are arranged along the second direction, and each of the doped nitride-based semiconductor strips has a second width less than the first width. The second conductive strips are disposed on the doped nitride-based semiconductor strips, respectively.

In accordance with one aspect of the present disclosure, a nitride-based semiconductor device is provided. A semiconductor device includes a first nitride-based semiconductor layer, a second nitride-based semiconductor layer, a pair of first electrodes, a second electrode, a doped nitride-based semiconductor layer, and a pair of gate electrodes. The second nitride-based semiconductor layer is disposed on the first nitride-based semiconductor layer and has a bandgap greater than a bandgap of the first nitride-based semiconductor layer. The first and second nitride-based semiconductor layers collectively have an active portion and an electrically isolating portion that is non-semi-conducting and surrounds the active portion to form an interface therebetween. The first electrodes are disposed over the second nitride-based semiconductor layer. The second electrode are disposed over the second nitride-based semiconductor layer and between the first electrodes. The doped nitride-based semiconductor layer is disposed over the second nitride-based semiconductor layer and between the first electrodes and surrounding the second electrode. The gate electrodes are disposed over the doped nitride-based semiconductor layer and located at opposite sides of the second electrode.

In accordance with one aspect of the present disclosure, a manufacturing method of a semiconductor device is provided. The method includes steps as follows. A first nitride-based semiconductor layer is formed. A second nitride-based semiconductor layer is formed on the first nitride-based semiconductor layer. A plurality of first conductive strips are formed over the second nitride-based semiconductor layer. A doped nitride-based semiconductor layer is formed over the second nitride-based semiconductor layer so as to enclose at least one of the first conductive strips. A mask layer is formed over the second nitride-based semiconductor layer, the first conductive strips, and the doped nitride-based semiconductor layer, in which a region of the second nitride-based semiconductor layer is exposed from the mask layer. An ion implantation process is performed on the first nitride-based semiconductor layer such that the first nitride-based semiconductor layer has an electrically isolating portion directly under the exposed region of the second nitride-based semiconductor layer.

In accordance with one aspect of the present disclosure, a nitride-based semiconductor device is provided. A semiconductor device includes a first nitride-based semiconductor layer, a second nitride-based semiconductor layer, a doped nitride-based semiconductor layer, a plurality of source/drain (S/D) electrodes, and a pair of gate electrodes. The second nitride-based semiconductor layer is disposed on the first nitride-based semiconductor layer and has a bandgap greater than a bandgap of the first nitride-based semiconductor layer. The first and second nitride-based semiconductor layers collectively have an active portion and an electrically isolating portion that is non-semi-conducting and surrounds the active portion to form an interface therebetween. The doped nitride-based semiconductor layer is disposed over the second nitride-based semiconductor layer, in which a vertical projection of the doped nitride-based semiconductor layer on the second nitride-based semiconductor layer is spaced apart from the interface. The S/D electrodes are disposed over the second nitride-based semiconductor layer, in which at least one of the S/D electrodes is enclosed by the doped nitride-based semiconductor layer. The gate electrodes are disposed on the doped nitride-based semiconductor layer.

According to the above configurations, the doped nitride-based semiconductor layer can be formed with different shapes. With the layout of the active portion and the electrically isolating portion, the side surface/sidewall of the doped nitride-based semiconductor layer can avoid the damage by ions during the ion implantation process, so as to have the operation of the semiconductor device stable, which results from reducing the possible leakage current.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 1B is a cross-sectional view across a line 1B-1B' of the semiconductor device in FIG. 1A;

FIG. 3A, FIG. 3B, FIG. 4A, FIG. 4B, FIG. 5A, FIG. 5B, FIG. 6A, and FIG. 6B depict different stages of a method for manufacturing the semiconductor device;

FIG. 10A, FIG. 10B, FIG. 11A, FIG. 11B, FIG. 12A, and FIG. 12B depict different stages of a method for manufacturing the semiconductor device;

DETAILED DESCRIPTION

Figure 1A:
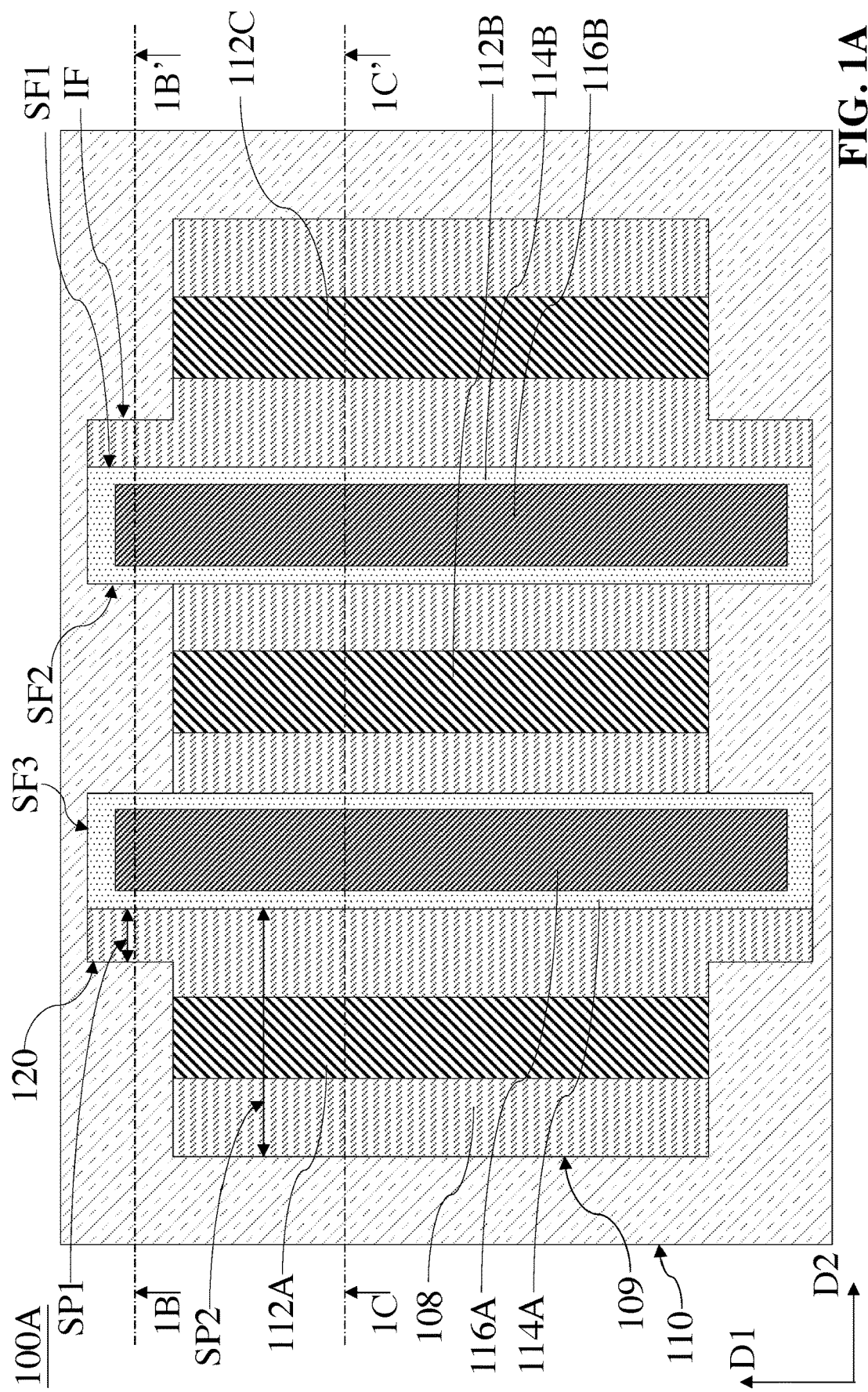
FIG. 1A is a top view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a top view of a semiconductor device 100A according to some embodiments of the present disclosure. The top view can show a relationship among electrodes 112A, 112B, 112C and gate electrodes 116A and 116B. These electrodes can constitute parts of transistors in the semiconductor device 100A. Herein, the top views means that the electrodes 112A, 112B, 112C and gate electrodes 116A and 116B are formed as layers and viewed along a direction normal to these layers. To illustrate, a direction D1 and a direction D2 different than the direction D1 are labeled. In some embodiments, the direction D1 is the vertical direction and the direction D2 is the horizontal direction, which are orthogonal to each other.

The gate electrode 116A is disposed between the electrodes 112A and 112C. The gate electrode 116B is disposed between the electrodes 112B and 112C. Each of the electrodes 112A, 112B, 112C can serve as a source/drain (S/D) electrode (i.e., which is a source electrode or a drain electrode). A combination of the electrodes 112A, 112B, 112C and gate electrodes 116A and 116B which extend along the direction D1 and are alternately arranged along the direction D2 can serve as two transistors (i.e., S/D, G, S/D, G, and S/D arranged in sequence).

The semiconductor device 100A has an active portion 109 and an electrically isolating portion 110 to define a device boundary. The electrically isolating portion 110 is non-semi-conducting. Herein, the term "non-semi-conducting" means the electrically isolating portion 110 can still provide an electrical isolation property even it is biased. The electrically isolating portion 110 surrounds the active portion 109. The electrically isolating portion 110 can form an interface IF with the active portion 109. The interface IF acts as the device boundary. For example, as shown in the top view, the electrodes 112A, 112B, 112C and the gate electrodes 116A and 116B are within the active portion 109 and thus are within the device boundary defined by the interface IF.

The semiconductor device 100A can further include doped nitride-based semiconductor layers 114A and 114B to bring the semiconductor device 100A into a normally-off state. The doped nitride-based semiconductor layers 114A and 114B are separated from each other. The pair of the doped nitride-based semiconductor layers 114A and 114B are located between the electrodes 112A and 112C. The electrode 112B is located between the pair of the doped nitride-based semiconductor layers 114A and 114B.

Each of the doped nitride-based semiconductor layers 114A and 114B can have a side surface SF1 facing away from the electrode 112B and spaced apart from the interface IF, which will be advantageous to improvement of the performance of the semiconductor device 100A. The further explanation regarding the improvement and more structural details of the semiconductor device 100A are provided as follows.

Figure 1C:
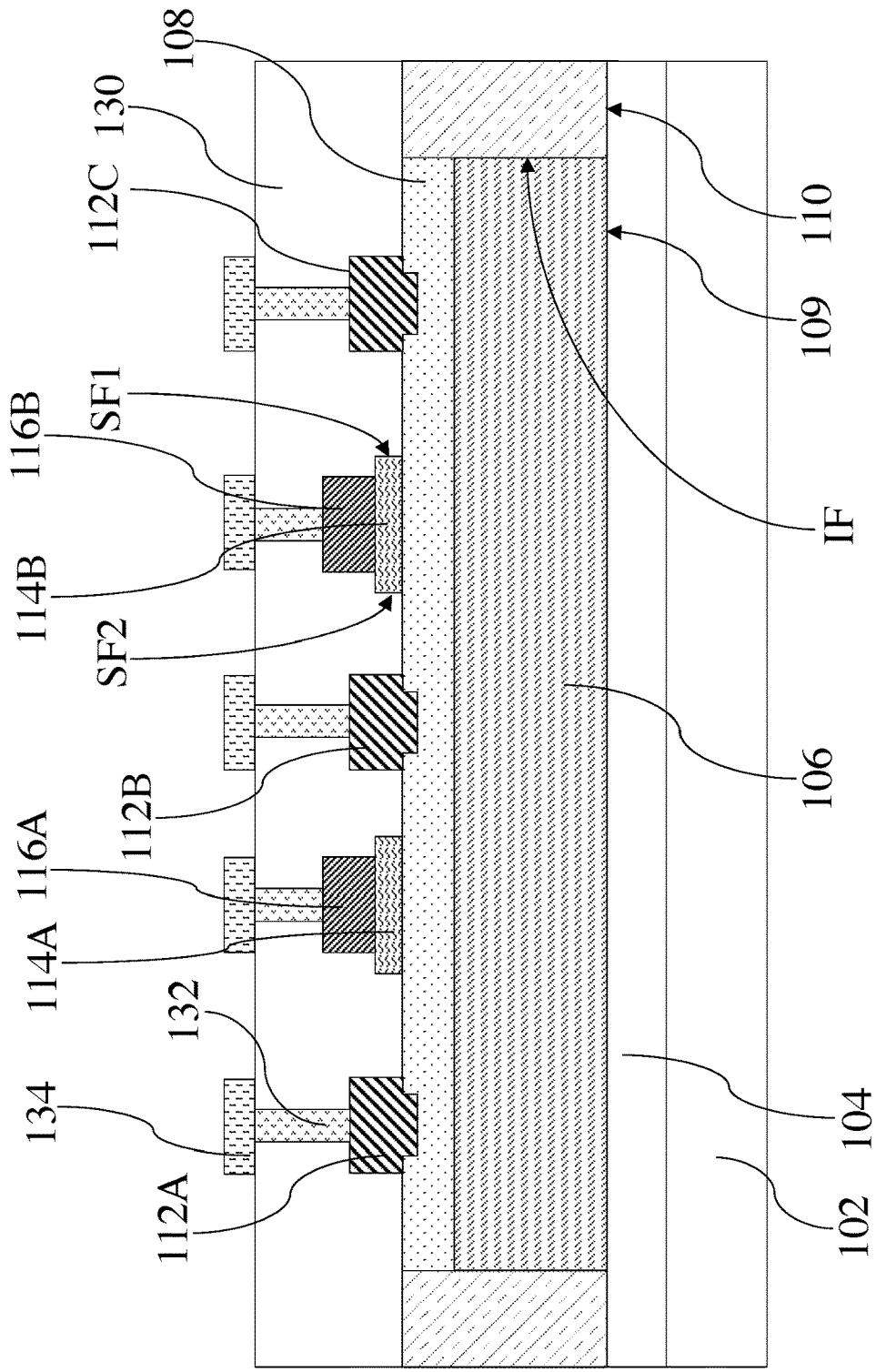
FIG. 1C is a cross-sectional view across a line 1C-1C' of the semiconductor device in FIG. 1A.

FIG. 1B is a cross-sectional view across a line 1B-1B' of the semiconductor device 100A in FIG. 1A, and FIG. 1C is a cross-sectional view across a line 1C-1C' of the semiconductor device 100A in FIG. 1A. The semiconductor device 100A further includes a substrate 102, a buffer layer 104, nitride-based semiconductor layers 106 and 108, contact vias 132, and a patterned conductive layer 134.

The substrate 102 may be a semiconductor substrate or another substrate material. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The buffer layer 104 can be disposed above the substrate 102. The buffer layer 104 can be configured to reduce lattice and thermal mismatches between the substrate 102 and a layer formed to be formed over the substrate 102 (e.g., the nitride-based semiconductor layer 106), thereby reducing defects due to the mismatches/difference. The buffer layer 104 may include a III-V compound. The III-V compound can include, for example but are not limited to, aluminum, gallium, indium, nitrogen, or combinations thereof. Accordingly, the exemplary materials of the buffer layer 104 can further include, for example but are not limited to, GaN, AlN, AlGaN, InAlGaN, or combinations thereof.

In some embodiments, the semiconductor device 100A may further include a nucleation layer (not illustrated). The nucleation layer may be formed between the substrate 102 and the buffer layer 104. The nucleation layer can be configured to provide a transition to accommodate a mismatch/difference between the substrate 102 and a III-nitride layer of the buffer layer 104. The exemplary material of the nucleation layer can include, for example but is not limited to AlN or any of its alloys.

The nitride-based semiconductor layer 106 is disposed over the buffer layer 104. The exemplary materials of the nitride-based semiconductor layer 106 can include, for example but are not limited to, nitrides or group III-V compounds, such as GaN, AlN, InN, $In_xAl_yGa_{(1-x-y)}N$ where $x+y\le1$, $Al_yGa_{(1-y)}N$ where $y\le1$. The nitride-based semiconductor layer 108 is disposed on the nitride-based semiconductor layer 106. The exemplary materials of the nitride-based semiconductor layer 108 can include, for example but are not limited to, nitrides or group III-V compounds, such as GaN, AlN, InN, $In_xAl_yGa_{(1-x-y)}N$ where $x+y\le1$, $Al_yGa_{(1-y)}N$ where $y\le1$.

The exemplary materials of the nitride-based semiconductor layers 106 and 108 are selected such that the nitride-based semiconductor layer 108 has a bandgap (i.e., forbidden band width) greater than a bandgap of the nitride-based semiconductor layer 106, which causes electron affinities thereof different from each other and forms a heterojunction therebetween. For example, when the nitride-based semiconductor layer 106 is an undoped GaN layer having bandgap of approximately 3.4 eV, the nitride-based semiconductor layer 108 can be selected as an AlGaN layer having bandgap of approximately 4.0 eV. As such, the nitride-based semiconductor layers 106 and 108 can serve as a channel layer and a barrier layer, respectively. A triangular well potential is generated at a bonded interface between the channel and barrier layers, so that electrons accumulate in the triangular well potential, thereby generating a two-dimensional electron gas (2DEG) region adjacent to the heterojunction. Accordingly, the semiconductor device 100A is available to include at least one GaN-based high-electron-mobility transistor (HEMT) located within the active portion 109 and surrounded by the electrically isolating portion 110.

The active portion 109 and the electrically isolating portion 110 as afore-mentioned are formed in the nitride-based semiconductor layers 106 and 108. That is, the nitride-based semiconductor layers 106 and 108 can collectively have the active portion 109 and the electrically isolating portion 110. In some embodiments, the electrically isolating portion 110 of the nitride-based semiconductor layers 106 and 108 can be doped with ions to achieve the electrically isolating purpose. The ions can include, for example but are not limited to, nitrogen ion, fluorine ion, oxygen ion, argon atom, aluminum atom, or combinations thereof. These dopants can make the electrically isolating portion 110 have a high resistivity and thus act as an electrically isolating region.

The electrodes 112A-112C can be disposed on/over/above the nitride-based semiconductor layer 108. Any pair of the adjacent electrodes 112A-112C can be located at two opposite sides of the corresponding gate electrode 114A or 114B. In other embodiments, although other configurations may be used, particularly when plural source, drain, or gate electrodes are employed in the same device.

In some embodiments, each of the electrodes 112A-112C can include, for example but are not limited to, metals, alloys, doped semiconductor materials (such as doped crystalline silicon), compounds such as silicides and nitrides, other conductor materials, or combinations thereof. The exemplary materials of each of the electrodes 112A-112C can include, for example but are not limited to, Ti, AlSi, TiN, or combinations thereof. Each of the electrodes 112A-112C may be a single layer, or plural layers of the same or different composition. In some embodiments, the electrodes 112A-112C form ohmic contact with the nitride-based semiconductor layer 108. The ohmic contact can be achieved by applying Ti, Al, or other suitable materials to the electrodes 112A-112C. In some embodiments, each of the electrodes 112A-112C is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof. In some embodiments, the nitride-based semiconductor layer 108 has recesses filled with bottom portions of the electrodes 112A-112C.

The doped nitride-based semiconductor layers 114A and 114B and the gate electrodes 116A and 116B can be disposed on/over/above the nitride-based semiconductor layer 108. The doped nitride-based semiconductor layers 114A and 114B and the gate electrodes 116A and 116B can be stacked on the nitride-based semiconductor layer 108. Each of the doped nitride-based semiconductor layers 114A and 114B is between the nitride-based semiconductor layer 108 and the corresponding gate electrode 116A or 116B. In some embodiments, the semiconductor device 100A may further include an optional dielectric layer (not illustrated) stacked on/over/above the nitride-based semiconductor layer 108 and below the gate electrodes 116A and 116B.

In the exemplary illustration of FIGS. 1B and 1C, the semiconductor device 100A is an enhancement mode device, which is in a normally-off state when the gate electrodes 116A and 116B are at approximately zero bias. Specifically, the doped nitride-based semiconductor layers 114A and 114B may create at least one p-n junction with the nitride-based semiconductor layer 108 to deplete the 2DEG region, such that zones of the 2DEG region corresponding to positions below the gate electrodes 116A and 116B can have different characteristics (e.g., different electron concentrations) than the rest of the 2DEG region and thus is blocked. Due to such mechanism, the semiconductor device 100A has a normally-off characteristic. In other words, when no voltage is applied to the gate electrodes 116A and 116B or a voltage applied to the gate electrodes 116A and 116B is less than a threshold voltage (i.e., a minimum voltage required to form an inversion layer below the gate electrodes 116A and 116B), the zones of the 2DEG region below the gate electrodes 116A and 116B are kept blocked, and thus no current flows therethrough. Moreover, by providing the doped nitride-based semiconductor layers 114A and 114B, gate leakage current is reduced and an increase in the threshold voltage during the off-state is achieved.

The exemplary materials of the doped nitride-based semiconductor layers 114A and 114B can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as B, Be, Mg, Zn, and Cd. In some embodiments, the nitride-based semiconductor layer 106 includes undoped GaN and the nitride-based semiconductor layer 108 includes AlGaN, and the doped nitride-based semiconductor layers 114A and 114B are p-type GaN layers which can bend the underlying band structure upwards and to deplete the corresponding zones of the 2DEG region, so as to place the semiconductor device 100A into an off-state condition. In some embodiments, the gate electrodes 116A and 116B may include metals or metal compounds. The gate electrodes 116A and 116B may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Si, metal alloys or compounds thereof, or other metallic compounds. In some embodiments, the exemplary materials of the gate electrodes 116A and 116B may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, $HfZrO$, $Ta_2O_3$, $HfSiO_4$, $ZrO_2$, $ZrSiO_2$, etc), or combinations thereof.

In the exemplary illustration of FIG. 1C, any pair of the adjacent electrodes 112A-112C are asymmetrical about the gate electrode 116A or 116B therebetween (i.e., one of the pair is closer to the corresponding the gate electrode 116A or 116B than another one of the pair). In other embodiments, the pair of the electrodes 112A-112C are symmetrical about the gate electrode 116A or 116B therebetween.

The above structural features can collectively constitute a nitride-based/GaN-based HEMT with the 2DEG regions, which can be called a nitride-based/GaN-based semiconductor device as well.

As afore-mentioned, each of the doped nitride-based semiconductor layers 114A and 114B can have the side surface SF1 spaced apart from the interface IF. The reason is that the formation of the electrically isolating portion 110 involves the ion implantation process, which might damage at lease one edge of the doped nitride-based semiconductor layers 114A or 114B. Once the edge of the doped nitride-based semiconductor layer 114A or 114B is damaged, at least one leakage current flow would occur across the edge, reducing the performance of the semiconductor device 100A. To illustrate, FIG. 2 depicts a semiconductor device 10 according to a comparison embodiment of the present disclosure.

Figure 2:
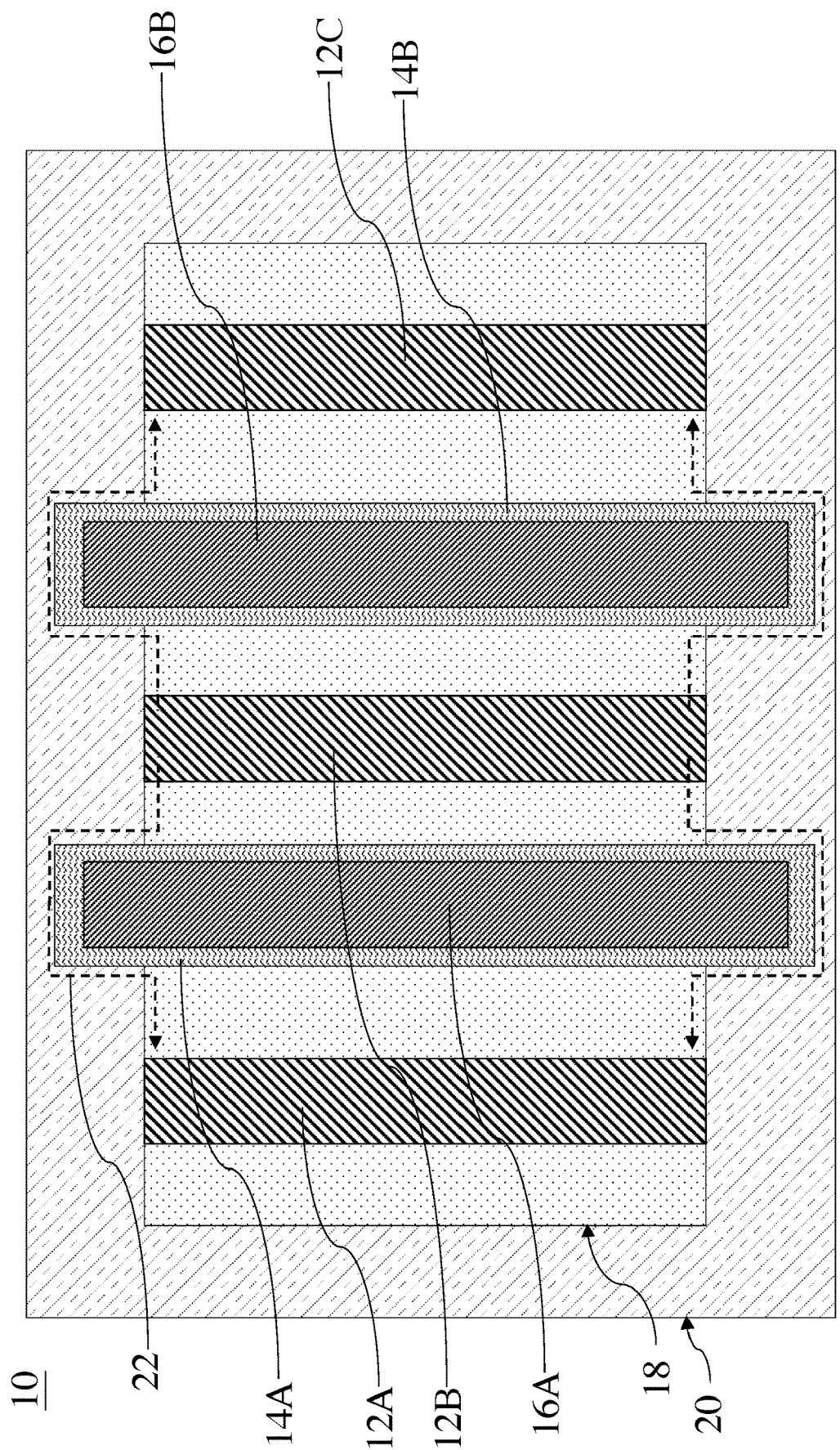
FIG. 2 depicts a semiconductor device according to a comparison embodiment of the present disclosure.

As shown in FIG. 2, the semiconductor device 10 includes electrodes 12A, 12B, and 12C, doped nitride-based semiconductor layers 14A and 14B, gate electrodes 16A and 16B within an active portion 18 and an electrically isolating portion 20 surrounding the active portion 18. The ends of the doped nitride-based semiconductor layers 14A and 14B are totally enclosed by the electrically isolating portion 20, resulting from an ion implantation process. During the ion implantation process, ions might damage the edges of the ends of the doped nitride-based semiconductor layers 14A and 14B, which creates defects at the same position. Accordingly, due to the defects, when the electrode 12B is biased, at least one current path from the electrode 12B to the ends of the doped nitride-based semiconductor layers 14A and 14B is formed, such that at least one leakage current 22 will flow therethrough and thus the performance of the semiconductor device 10 may be impaired.

Referring to FIGS. 1A and 1B again, since the side surface SF1 of each of the doped nitride-based semiconductor layers 114A and 114B is spaced apart from the interface IF, the side surface SF1 can avoid being damaged by ions during an ion implantation process. That is, it can avoid the side surface SF1 of each of the doped nitride-based semiconductor layers 114A and 114B becoming a part of a leakage current path. As such, the electrically isolating portion 110 can have at least one concave 120 wider than the doped nitride-based semiconductor layers 114A and 114B. For example, at least one pair of the concaves 120 of the electrically isolating portion 110 can receive the active portion 109, and the doped nitride-based semiconductor layers 114A and 114B extend to partially cover the received active portion (i.e., some of the active portion 109 within the concaves 120 are uncovered with the doped nitride-based semiconductor layers 114A and 114B). Each of the doped nitride-based semiconductor layers 114A and 114B can have a boundary aligning with a boundary of the corresponding concave 120 of the electrically isolating portion 110.

Furthermore, the side surface SF1 of each of the doped nitride-based semiconductor layers 114A and 114B can be spaced apart from the interface IF by two vertical spacings SP1 and SP2. The vertical spacing SP1 is a distance from the side surface SF1 to the boundary of the concave 120. The vertical spacing SP2 is a distance from the side surface SF1 to the side boundary of the active portion 109, which is across the electrode 112A or 112C. The vertical spacing SP2 is greater than the vertical spacing SP1.

The electrodes 112A, 112B, 112C, the gate electrodes 116A and 116B, and the doped nitride-based semiconductor layers 114A and 114B viewed along a direction normal to the nitride-based semiconductor layer 108 are strips extending along the direction D1 and arranged along the direction D2. The strips of the doped nitride-based semiconductor layers 114A and 114B are longer than the strips of the electrodes 112A, 112B, and 112C. The strip of the electrode 112B is collectively enclosed by the interface IF and boundaries of the doped nitride-based semiconductor layers 114A and 114B. The electrically isolating portion 110 can block/confine the current flow upward/downward from the electrode 112B. To enclose the strip of the electrode 112B, inner boundaries of the doped nitride-based semiconductor layers 114A and 114B can align with the interface IF from the top view.

More specifically, the doped nitride-based semiconductor layers 114A and 114B have side surfaces SF2 facing each other. The side surfaces SF2 are closer to the interface IF than the side surfaces SF1. The side surfaces SF2 can partially align with the interface IF. A part of the interface IF extends from one of the side surfaces SF2 to another one of the side surfaces SF2. The part of the interface IF further extends to align with end surface of the electrode 112B from the top view. Moreover, each of the doped nitride-based semiconductor layers 114A and 114B can further have a pair of end surfaces SF3 aligning with the interface IF. As such, from the top view, the strip of the electrode 112B is enclosed/surrounded entirely by the boundaries of the electrically isolating portion 110 and the doped nitride-based semiconductor layers 114A and 114B.

Therefore, the layout of the semiconductor device 100A can avoid the damage on the side surface SF1 of the doped nitride-based semiconductor layers 114A and 114B as well as still confining the current flow from the electrode 112B.

Referring to FIG. 1C, the semiconductor device 100A further includes a passivation layer 130, contact vias 132, and a patterned conductive layer 134.

The passivation layer 130 is disposed on the nitride-based semiconductor layer 108. The passivation layer 130 covers the electrodes 112A-112C, the doped nitride-based semiconductor layers 114A and 114B, and the gate electrodes 116A and 116B. The passivation layer 130 can serve as a planarization layer which has a level top surface to support other layers/elements. In some embodiments, the passivation layer 130 can be formed as being thicker, and a planarization process, such as a chemical mechanical polish (CMP) process, is performed on the passivation layer 130 to remove the excess portions, thereby forming a level top surface. The exemplary materials of the passivation layer 130 can include, for example but are not limited to, $SiN_x$, $SiO_x$, $Si_3N_4$, SiON, SiC, SiBN, SiCBN, oxides, PEOX, or combinations thereof. In some embodiments, the passivation layer 130 is a multi-layered structure, such as a composite dielectric layer of $Al_2O_3/SiN$, $Al_2O_3/SiO_2$, AlN/SiN, AlN/$SiO_2$, or combinations thereof.

The contact vias 132 are disposed within the passivation layer 130. The contact vias 132 penetrate the passivation layer 130. The contact vias 132 extend longitudinally to electrically couple with the electrodes 112A-112C and the gate electrodes 116A and 116B, respectively. The exemplary materials of the contact vias 132 can include, for example but are not limited to, conductive materials, such as metals or alloys.

The patterned conductive layer 134 is disposed on the passivation layer 130 and the contact vias 132. The patterned conductive layer 134 is in contact with the contact vias 132. The patterned conductive layer 134 may have metal lines, pads, traces, or combinations thereof, such that the patterned conductive layer 134 can form at least one circuit. The exemplary materials of the patterned conductive layer 134 can include, for example but are not limited to, conductive materials. The patterned conductive layer 134 may include a single film or multilayered film having Ag, Al, Cu, Mo, Ni, Ti, alloys thereof, oxides thereof, nitrides thereof, or combinations thereof.

The contact vias 132 and the patterned conductive layer 134 can be modified according to the practical applications. For example, the positions of them can be varied in other embodiments.

Different stages of a method for manufacturing the semiconductor device 100A are shown in FIG. 3A, FIG. 3B, FIG. 4A, FIG. 4B, FIG. 5A, FIG. 5B, FIG. 6A, and FIG. 6B. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Referring to FIG. 3A and FIG. 3B, which is a cross-sectional view across a line 3B-3B' in FIG. 3A, a substrate 102 is provided. A buffer layer 104 and nitride-based semiconductor layers 106 and 108 can be formed over the substrate 102 in sequence by using deposition techniques. Electrodes 112 and doped nitride-based semiconductor layers 114A and 114B can be formed above the nitride-based semiconductor layer 108. The formation of the electrodes 112 include deposition techniques and a patterning process. The formation of the doped nitride-based semiconductor layers 114A and 114B include deposition techniques and a patterning process. The deposition techniques can be performed for forming a blanket layer, and the patterning process can be performed for removing excess portions thereof. In some embodiments, the patterning process can include photolithography, exposure and development, etching, other suitable processes, or combinations thereof. The electrodes 112 and the doped nitride-based semiconductor layers 114A and 114B are patterned to become strips, which can be called conductive strips and doped nitride-based semiconductor strips.

Referring to FIG. 4A and FIG. 4B, which is a cross-sectional view across a line 4B-4B' in FIG. 4A, protection layers 136 are formed over the nitride-based semiconductor layer 108. The protection layers 136 are separated from each other and respectively cover different regions of the doped nitride-based semiconductor layers 114A and 114B. More specifically, each of the doped nitride-based semiconductor layers 114A and 114B has a side surface partially covered with the corresponding protection layer 136. In some embodiments, the exemplary materials of the protection layers 136 can include, for example but are not limited to, oxides, such as silicon dioxide ($SiO_2$). In some embodiments, the exemplary materials of the protection layers 136 can include, for example but are not limited to, dielectrics, such as silicon nitride (SiN). In some embodiments, the exemplary materials of the protection layers 136 can include, for example but are not limited to TiN or Al—Cu.

Referring to FIG. 5A and FIG. 5B, which is a cross-sectional view across a line 5B-5B' in FIG. 5A, a mask layer 140 is formed over the nitride-based semiconductor layer 108, the electrodes 112, and the doped nitride-based semiconductor layers 114A and 114B. The side surface of each of the doped nitride-based semiconductor layers 114A and 114B is entirely covered with the mask layer 140. The mask layer 140 can have a boundary partially aligning with a boundary of the doped nitride-based semiconductor layers 114A and 114B. The nitride-based semiconductor layer 108 has a region exposed from the mask layer 140. The mask layer can protect the underlying layers from ions during an ion implantation process. Accordingly, the entirety of the side surface of each of the doped nitride-based semiconductor layers 114A and 114B can be protected from the ion implantation by the mask layer 140. The protection layers 136 can further protect the underlying side surfaces of the doped nitride-based semiconductor layers 114A and 114B from the ions. Thereafter, an ion implantation process is performed such that ion beams 142 can be directed into the nitride-based semiconductor layers 106 and 108 via the exposed region of the nitride-based semiconductor layer 108.

Referring to FIG. 6A and FIG. 6B, which is a cross-sectional view across a line 6B-6B' in FIG. 6A, the mask layer 140 is removed. By the ion implantation process as shown in FIG. 5A and FIG. 5B, the nitride-based semiconductor layers 106 and 108 can collectively have an electrically isolating portion 110 directly under the exposed region of the nitride-based semiconductor layer 108 (i.e., which is exposed from the mask layer 140 in FIG. 5A and FIG. 5B). In some embodiments, the protection layers 136 can be removed. Thereafter, a pair of gate electrodes, which can be called conductive strips, can be formed over the doped nitride-based semiconductor layers 114A and 114B to obtain the structure as shown in FIGS. 1A-1C.

Figure 7A:
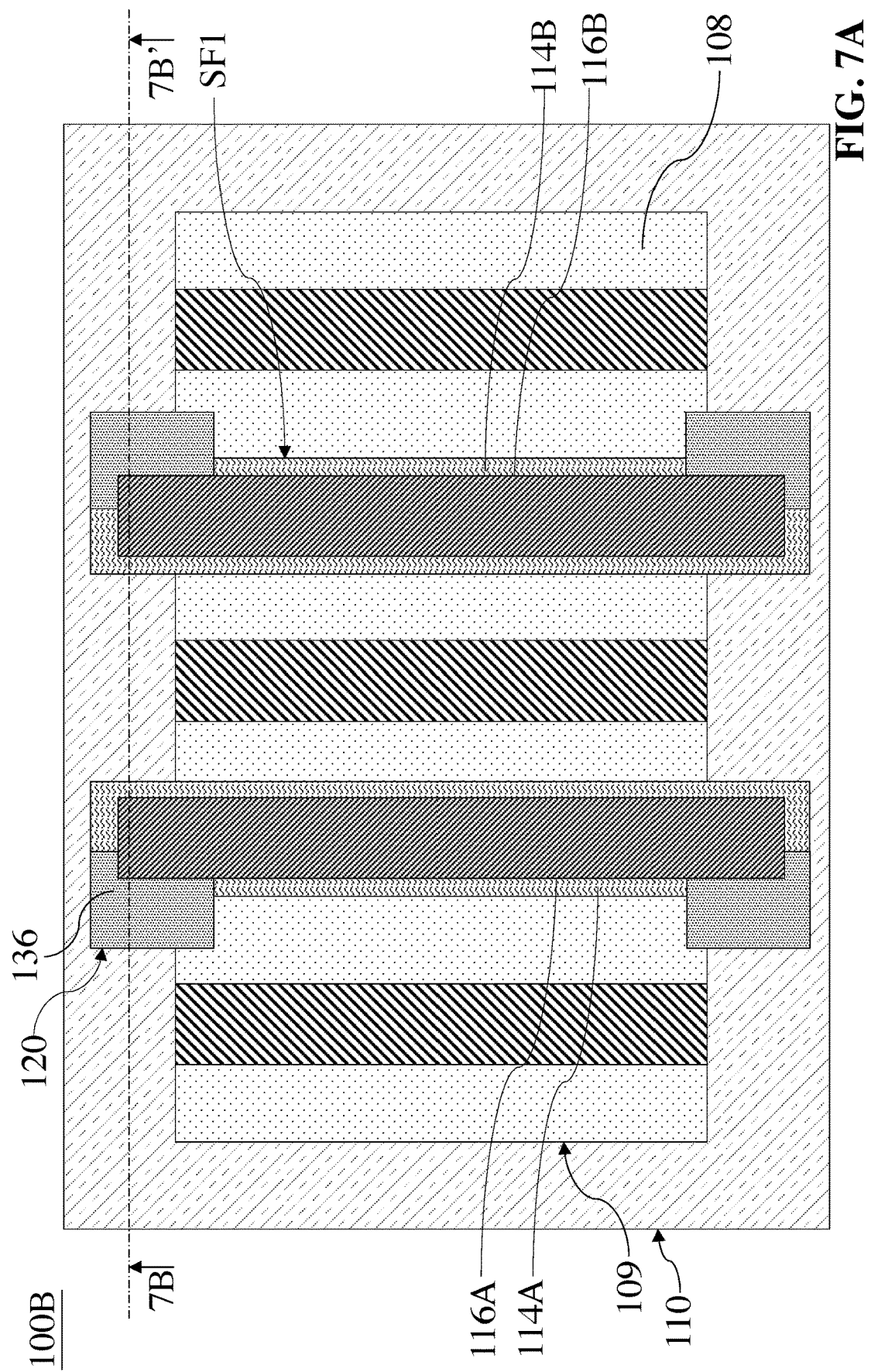
FIG. 7A is a top view of a semiconductor device according to some embodiments of the present disclosure.
Figure 7B:
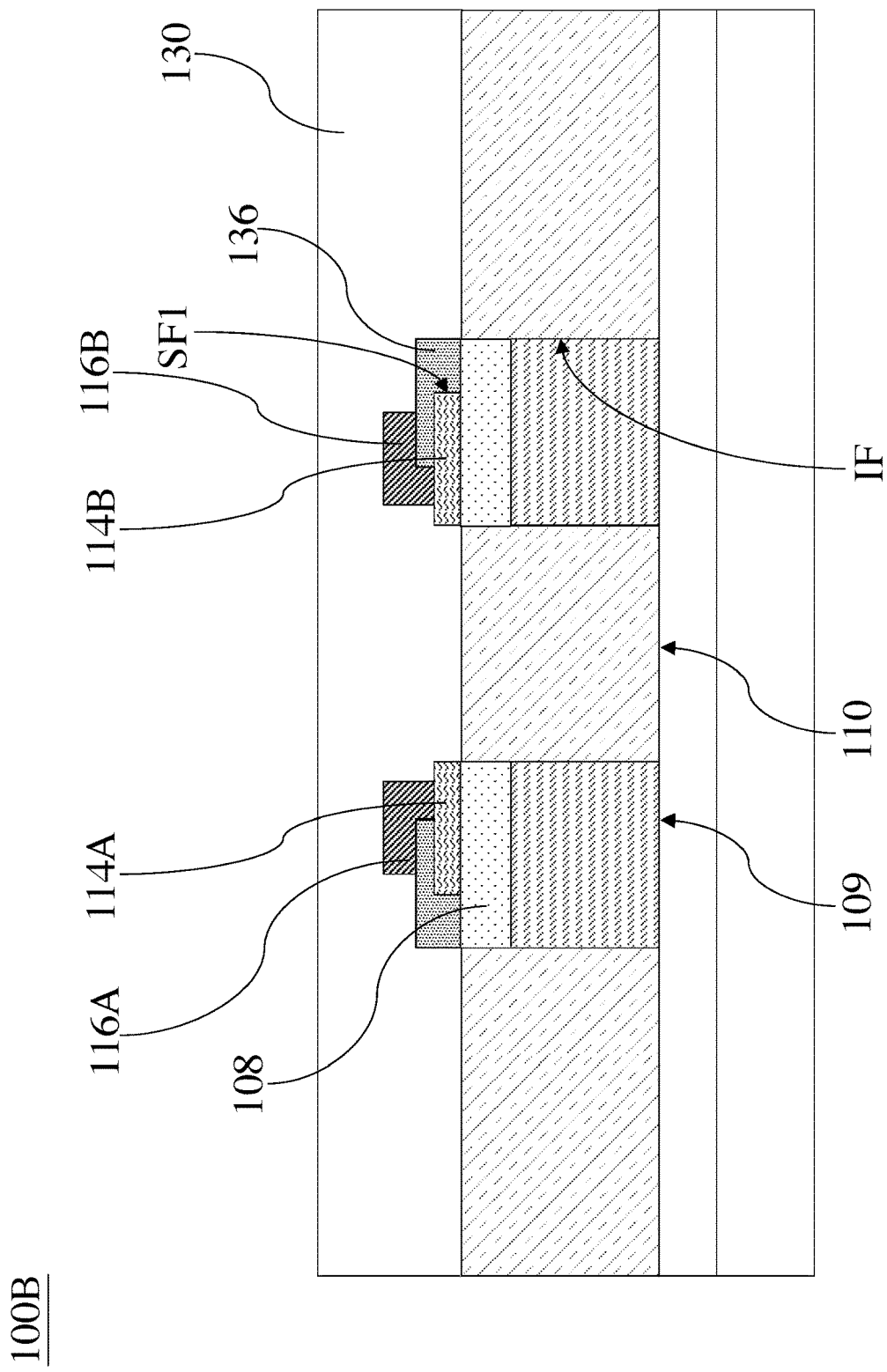
FIG. 7B is a cross-sectional view across a line 7B-7B' of the semiconductor device in FIG. 7A.

FIG. 7A is a top view of a semiconductor device 100B according to some embodiments of the present disclosure. FIG. 7B is a cross-sectional view across a line 7B-7B' of the semiconductor device 100B in FIG. 7A. In the present embodiment, as shown in the exemplary illustrations of FIGS. 7A and 7B, a plurality of protection layers 136 remain during the process stage. The protection layers 136 are disposed over the nitride-based semiconductor layer 108 and the doped nitride-based semiconductor layers 114A and 114B. The protection layers 136 are located above the concaves 120 of the electrically isolating portion 110. Each of the protection layers 136 has a boundary aligning with a boundary of the corresponding concave 120. Some portions of the side surfaces SF1 of the doped nitride-based semiconductor layers 114A and 114B are covered with the protection layers 136.

Each of the protection layers 136 is located between the doped nitride-based semiconductor layer 114A and the gate electrode 116A or between the doped nitride-based semiconductor layer 114B and the gate electrode 116B. More specifically, each of the protection layers 136 can extend from the active portion 109 to a top surface of the corresponding doped nitride-based semiconductor layer 114A or 114B with covering the portions of the side surfaces SF1. Since the protection layers 136 can serve as an iron protection during the process stage, the protection layers 136 would have boundaries aligning with the underlying interface IF. The semiconductor device 100B can further have a passivation layer 130 covering the protection layers 136. As afore-described, the protection layers 136 can further protect the underlying side surfaces SF1 of the doped nitride-based semiconductor layers 114A and 114B. Because the protection layers 136 would not interfere the operation mechanism of the semiconductor device 100B, these layers are available to remain, so as to simplify the manufacturing process.

Figure 8:
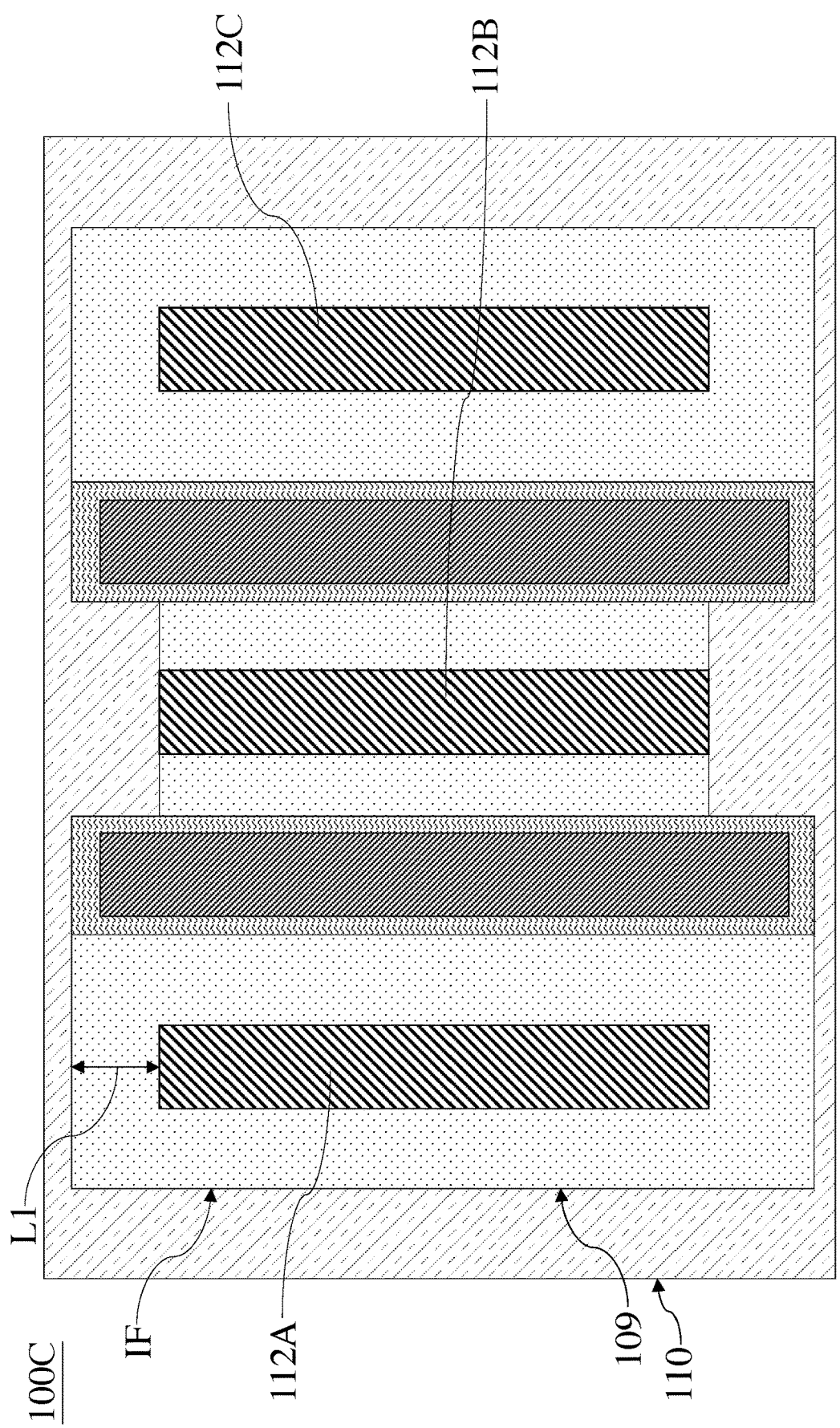
FIG. 8 is a top view of a semiconductor device according to some embodiments of the present disclosure.

FIG. 8 is a top view of a semiconductor device 100C according to some embodiments of the present disclosure. In the present embodiment, as shown in the exemplary illustrations of FIG. 8, a distance L1 from an end surface of the electrode 112A or 112C to the interface IF between the active portion 109 and the electrically isolating portion 110 is greater than a distance from an end surface of the electrode 112B to the interface IF between the active portion 109 and the electrically isolating portion 110. In some embodiments, the distance from the end surface of the electrode 112B to the interface IF is zero or approaching zero.

Figure 9A:
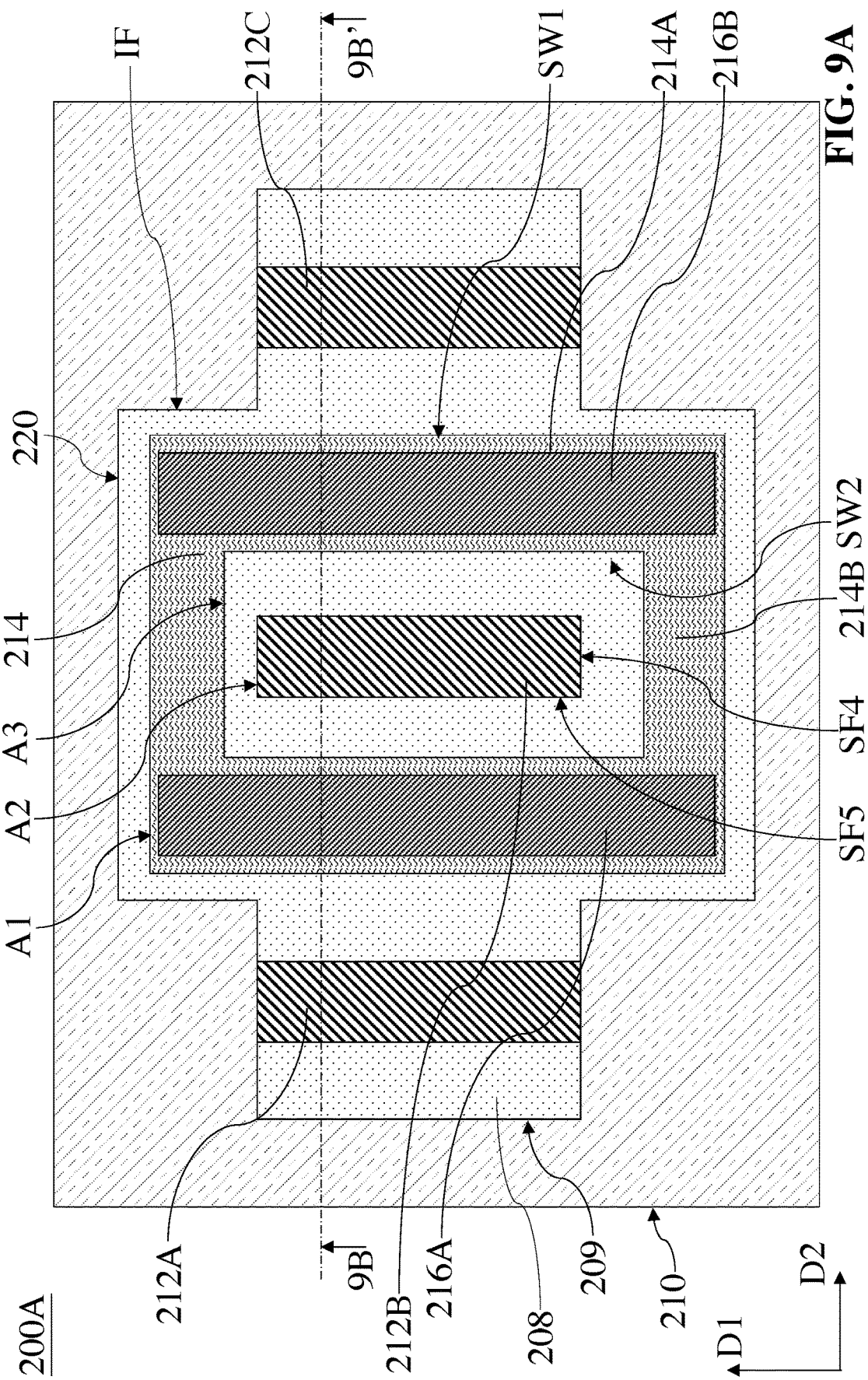
FIG. 9A is a top view of a semiconductor device according to some embodiments of the present disclosure.
Figure 9B:
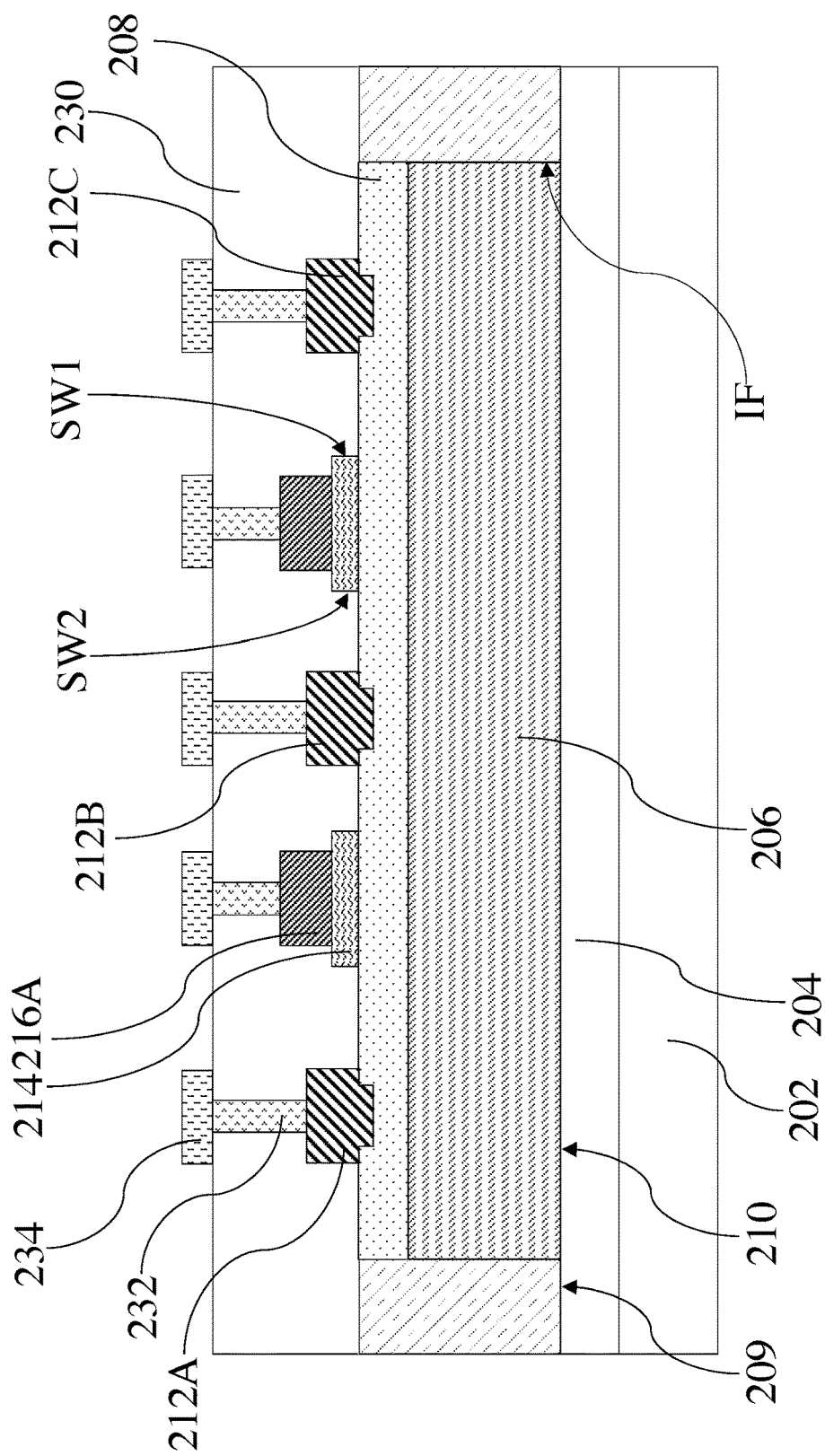
FIG. 9B is a cross-sectional view across a line 9B-9B' of the semiconductor device in FIG. 9A.

FIG. 9A is a top view of a semiconductor device 200A according to some embodiments of the present disclosure, and FIG. 9B is a cross-sectional view across a line 9B-9B' of the semiconductor device in FIG. 9A. To illustrate, a direction D1 and a direction D2 different than the direction D1 are labeled. In some embodiments, the direction D1 is the vertical direction and the direction D2 is the horizontal direction, which are orthogonal to each other.

In the present embodiment, a single doped nitride-based semiconductor layer 214 designed as being ring-shaped is putted into the semiconductor device 200A, instead of the pair of doped nitride-based semiconductor strips as mentioned above.

The semiconductor device 200A has an active portion 209 and an electrically isolating portion 210 surrounding/enclosing the active portion 209 to define a device boundary, similarly with the afore descriptions. The active portion 209 and the electrically isolating portion 210 can form an interface IF therebetween. The semiconductor device 200A includes a substrate 202, a buffer layer 204, nitride-based semiconductor layers 206 and 208, electrodes 212A, 212B, 212C, a doped nitride-based semiconductor layer 214, gate electrodes 216A and 216B, a passivation layer 230, contact vias 232, and a patterned conductive layer 234.

The configuration as afore-described in embodiments above can be applied to the substrate 202, the buffer layer 204, the passivation layer 230, the contact vias 232, and the patterned conductive layer 234, including that the nitride-based semiconductor layers 206 and 208 can collectively have the active portion 209 and the electrically isolating portion 210.

The electrodes 212A, 212B, 212C, the doped nitride-based semiconductor layer 214, and the gate electrodes 216A and 216B are disposed over/above/on the nitride-based semiconductor layer 208 and located within the active portion 209. The electrodes 212A, 212B, 212C and the gate electrodes 216A and 216B can be taken as conductive strips. These conductive strips extend along the direction D1 and are arranged along the direction D2. The conductive strips can be arranged as being parallel with each other. The electrode 212B, the doped nitride-based semiconductor layer 214, and the gate electrodes 216A and 216B are located between the electrodes 212A and 212C. The electrode 212B is located between the gate electrodes 216A and 216B (i.e., the gate electrodes 216A and 216B are located at opposite sides of the electrode 212B).

In other words, each of the electrodes 212A and 212C can be disposed closer to the electrically isolating portion 210 than the electrode 212B. Each of the electrodes 212A and 212C can be disposed closer to the electrically isolating portion 210 than the doped nitride-based semiconductor layer 214. The doped nitride-based semiconductor layer 214 can be disposed closer to the electrically isolating portion 210 than the electrode 212B. Such configuration is to constitute two transistors (i.e., S/D, G, S/D, G, and S/D arranged in sequence).

The doped nitride-based semiconductor layer 214 is ring-shaped from the top view. The ring-shaped doped nitride-based semiconductor layer 214 can have a pair of extending portions 214A and a pair of connection portions 214B. The extending portions 214A extend along the direction D1 and are arranged along the direction D2. The extending portions 214A underlie the gate electrodes 216A and 216B, respectively. The pair of connection portions 214B extend along the direction D2 and arranged along the direction D1 to connect the extending portions 214A to each other.

The ring-shaped doped nitride-based semiconductor layer 214 can surround/enclose the electrode 212B, blocking at least one leakage current from the electrode 212B. For example, the doped nitride-based semiconductor layer 214 can block a current/carrier flow upward/downward from the electrode 212B across the doped nitride-based semiconductor layer 214, thereby having the operation of the semiconductor device 200A stable.

In response to the side surface damaged issue as afore-mentioned, the doped nitride-based semiconductor layer 214 can have an outer sidewall SW1 (i.e., an outer side surface) separated from the electrically isolating portion 210, such that the outer sidewall SW1 can avoid being damaged by ions during an ion implantation process. More specifically, the doped nitride-based semiconductor layer 214 can cover a region A1 of the active portion 209, and the region A1 is separated from a boundary of the electrically isolating portion 210. As such, a vertical projection of an entirety of the outer sidewall SW1 on the nitride-based semiconductor layer 208 is within the active portion 209. That is, the vertical projection of the entirety of the outer sidewall SW1 on the nitride-based semiconductor layer 208 can be spaced apart the interface IF. Therefore, the outer sidewall SW1 can be spaced apart from the electrically isolating portion 210 by a spacing, avoiding damage to the doped nitride-based semiconductor layer 214 from ions during an ion implantation process.

The electrode 212B is separated from the region A1. More specifically, the electrode 212B can cover a region A2 of the active portion 209. The active portion 209 further has a region A3 between the regions A1 and A2. The region A1 surrounds/encloses the region A3. The region A3 surrounds/encloses the region A2.

Furthermore, the doped nitride-based semiconductor layer 214 has an inner sidewall SW2 entirely separated from the outer sidewall SW1. Accordingly, the doped nitride-based semiconductor layer 214 can form a closed loop pattern on the nitride-based semiconductor layer 208 (i.e., the vertical projection of the doped nitride-based semiconductor layer 214 on the nitride-based semiconductor layer 208 is in a closed loop pattern). The electrically isolating portion 210 can have a pair of concaves 220 to receive the closed loop pattern.

The electrode 212B is located within such ring shape and is surrounded/enclosed by the same. Specifically, the electrode 212B has a pair of end surfaces SF4 and a pair of side surfaces SF5 between the end surfaces SF4. The end surfaces SF4 face the inner sidewall SW2 of the doped nitride-based semiconductor layer 214. The side surfaces SF5 face the gate electrodes 216A and 216B, respectively, and face the inner sidewall SW2 of the doped nitride-based semiconductor layer 214. Moreover, the passivation layer 230 which covers the electrode 212B and the doped nitride-based semiconductor layer 214 can have a portion between the end surfaces SF4 and the inner sidewall SW2 and form interfaces with them, respectively.

Different stages of a method for manufacturing the semiconductor device 200A are shown in FIG. 10A, FIG. 10B, FIG. 11A, FIG. 11B, FIG. 12A, and FIG. 12B. In the following, deposition techniques can include, for example but are not limited to, ALD, PVD, CVD, MOCVD, PECVD, LPCVD, plasma-assisted vapor deposition, epitaxial growth, or other suitable processes.

Referring to FIG. 10A and FIG. 10B, which is a cross-sectional view of FIG. 10A, a substrate 202 is provided. A buffer layer 204 and nitride-based semiconductor layers 206 and 208 can be formed over the substrate 202 in sequence by using deposition techniques. Electrodes 212 and a doped nitride-based semiconductor layer 214 can be formed above the nitride-based semiconductor layer 208. The formation of the electrodes 212 include deposition techniques and a patterning process. The formation of the doped nitride-based semiconductor layer 214 include deposition techniques and a patterning process. The deposition techniques can be performed for forming a blanket layer, and the patterning process can be performed for removing excess portions thereof. In some embodiments, the patterning process can include photolithography, exposure and development, etching, other suitable processes, or combinations thereof. The electrodes 212 and the doped nitride-based semiconductor layer 214 are patterned to become strips, which can be called conductive strips and a doped nitride-based semiconductor strip with a closed loop pattern.

Referring to FIG. 11A and FIG. 11B, which is a cross-sectional view of FIG. 11A, a mask layer 240 is formed over the nitride-based semiconductor layer 208, the electrodes 212, and the doped nitride-based semiconductor layer 214. The side surfaces the doped nitride-based semiconductor layer 214 are entirely covered with the mask layer 240. The mask layer 240 can have an edge entirely remained a spacing from a boundary of the doped nitride-based semiconductor layer 214. The nitride-based semiconductor layer 208 has a region exposed from the mask layer 240. The mask layer 240 can protect the underlying layers from ions during an ion implantation process. For example, the mask layer 240 can protect the underlying side surfaces/sidewalls of the doped nitride-based semiconductor layer 214 from ions. Thereafter, an ion implantation process is performed such that ion beams 242 can be directed into the nitride-based semiconductor layers 206 and 208 via the exposed region of the nitride-based semiconductor layer 208.

Figure 12A:
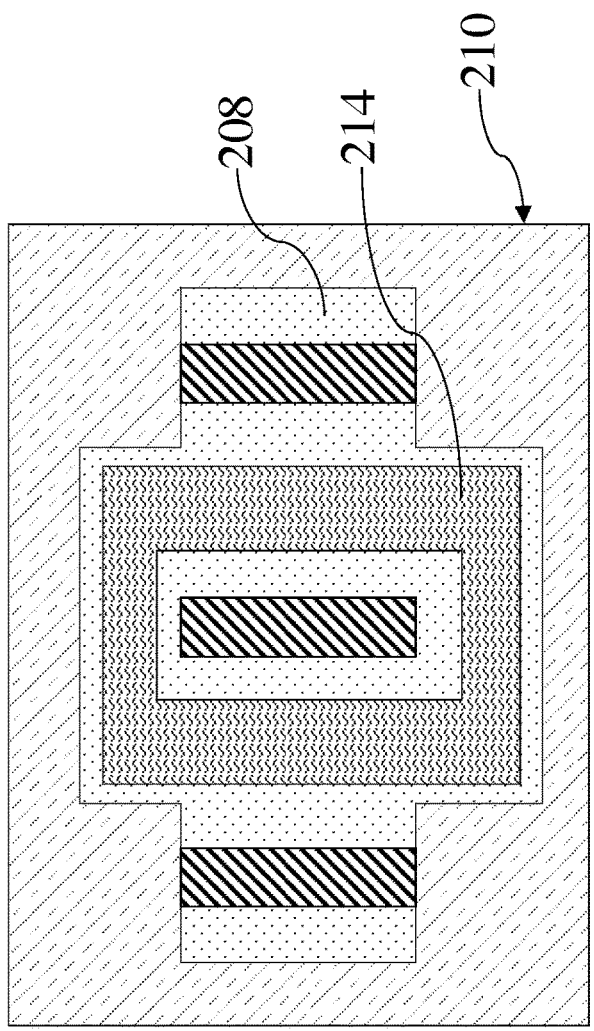
Figure 12B:
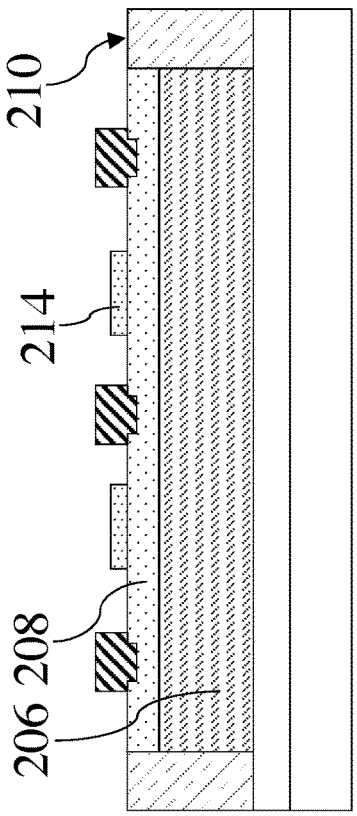

Referring to FIG. 12A and FIG. 12B, which is a cross-sectional view of FIG. 12A, the mask layer 240 is removed. By the ion implantation process as shown in FIG. 11A and FIG. 11B, the nitride-based semiconductor layers 206 and 208 can collectively have an electrically isolating portion 210 directly under the exposed region of the nitride-based semiconductor layer 208 (i.e., which is exposed from the mask layer 240 in FIG. 11A and FIG. 11B). Thereafter, a pair of gate electrodes, which can be called conductive strips, are formed over the doped nitride-based semiconductor layer 214 to obtain the structure as shown in FIGS. 9A and 9B.

Figure 13:
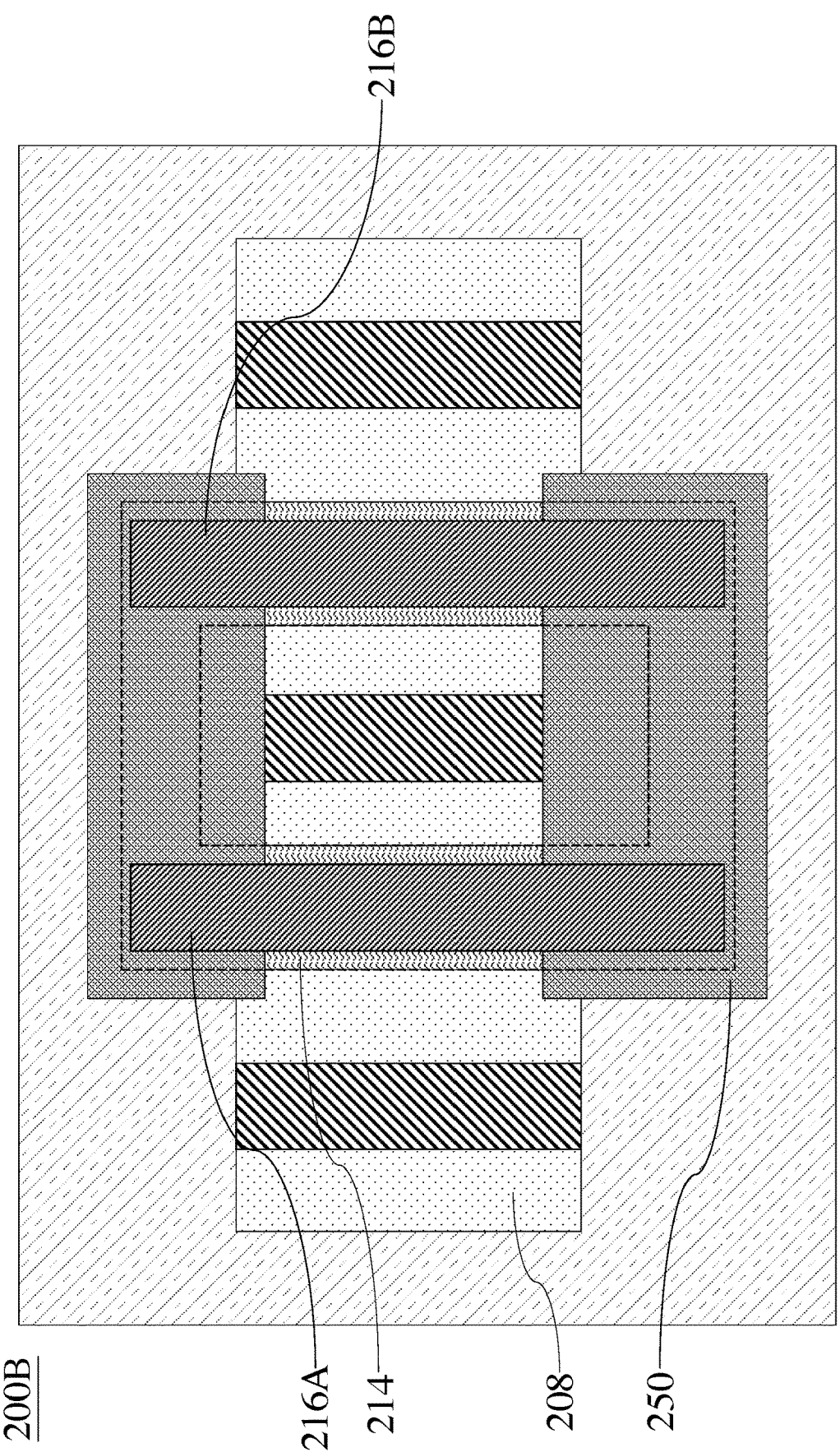
FIG. 13 is a top view of a semiconductor device according to some embodiments of the present disclosure.

FIG. 13 is a top view of a semiconductor device 200B according to some embodiments of the present disclosure. In the present embodiment, as shown in the exemplary illustration of FIG. 13, a protection layers 250 is disposed over the nitride-based semiconductor layer 208 and the doped nitride-based semiconductor layer 214. Some portions of the doped nitride-based semiconductor layer 214 are covered with the protection layers 250. The protection layer 250 is located between the doped nitride-based semiconductor layer 214 and the gate electrodes 216A and 216B. Since the protection layers 250 can serve as an iron protection during the process stage, the protection layers 250 would have boundaries aligning with the underlying interface IF. The protection layers 250 can further protect the underlying sidewall SW1 of the doped nitride-based semiconductor layer 214 from ions during an ion implantation process. In some embodiments, the exemplary materials of the protection layers 250 can include, for example but are not limited to, oxides, such as silicon dioxide ($SiO_2$). In some embodiments, the exemplary materials of the protection layers 250 can include, for example but are not limited to, dielectrics, such as silicon nitride (SiN). In some embodiments, the exemplary materials of the protection layers 250 can include, for example but are not limited to TiN, Al—Cu. The protection layers 250 would not interfere the operation mechanism of the semiconductor device 200B.

Figure 14B:
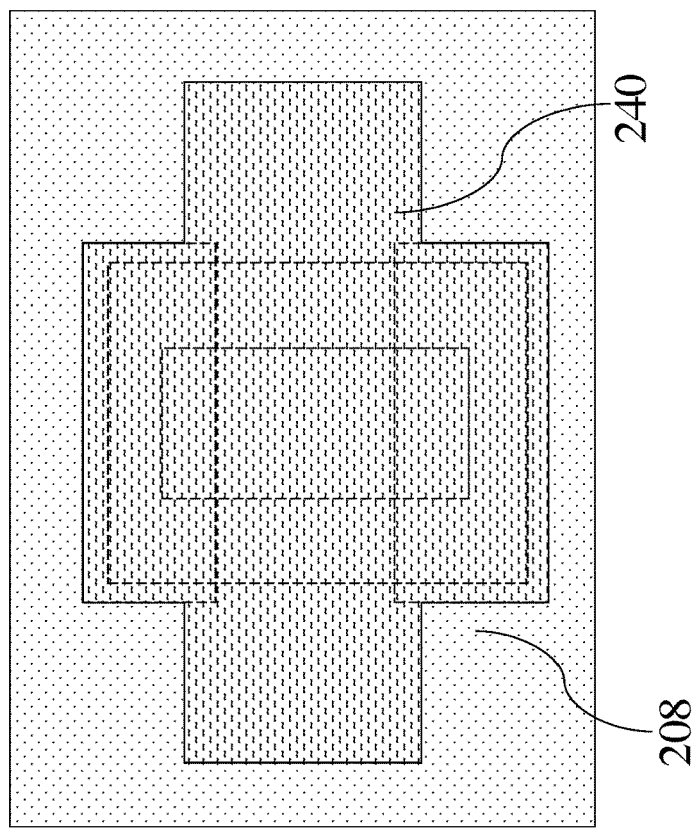
FIG. 14A and FIG. 14B depict different stages of a method for manufacturing the semiconductor device.
Figure 14A:
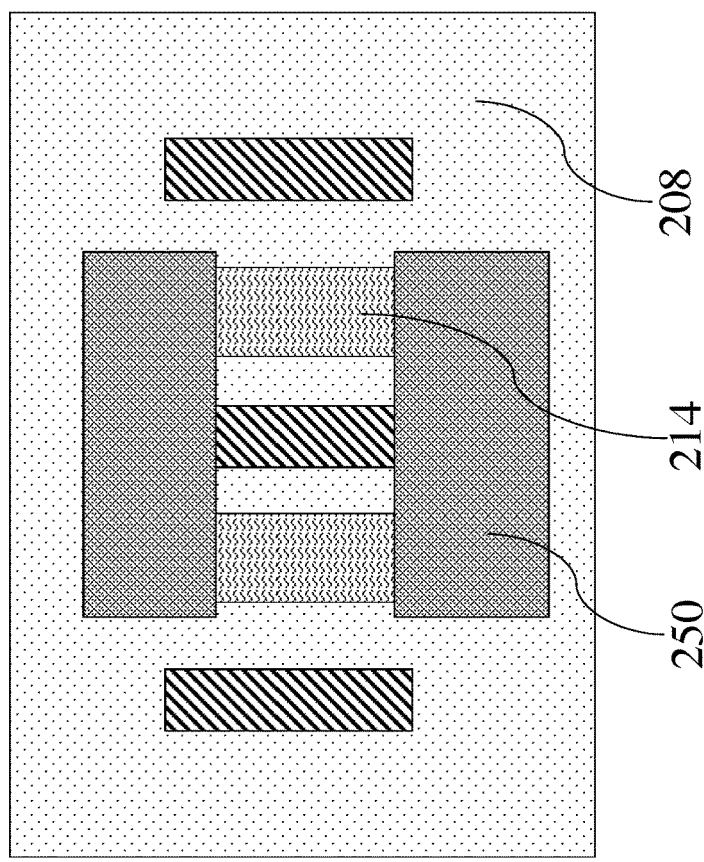

Different stages of a method for manufacturing the semiconductor device 200B are shown in FIG. 14A and FIG. 14B which is a cross-sectional view of FIG. 14A. Referring to FIG. 14A, protection layers 250 are formed over the nitride-based semiconductor layer 208. The protection layers 250 are separated from each other and respectively cover different regions of the doped nitride-based semiconductor layer 214. More specifically, the doped nitride-based semiconductor layer 214 has the outer sidewall partially covered with the protection layers 250. Referring to FIG. 14B, a mask layer 240 is formed over the nitride-based semiconductor layer 208 and the doped nitride-based semiconductor layer 214. The mask layer 240 can have an edge entirely remained a spacing from a boundary of the doped nitride-based semiconductor layer 214. Thereafter, an ion implantation process can be performed to form an electrically isolating portion in the nitride-based semiconductor layer 208.

Figure 15:
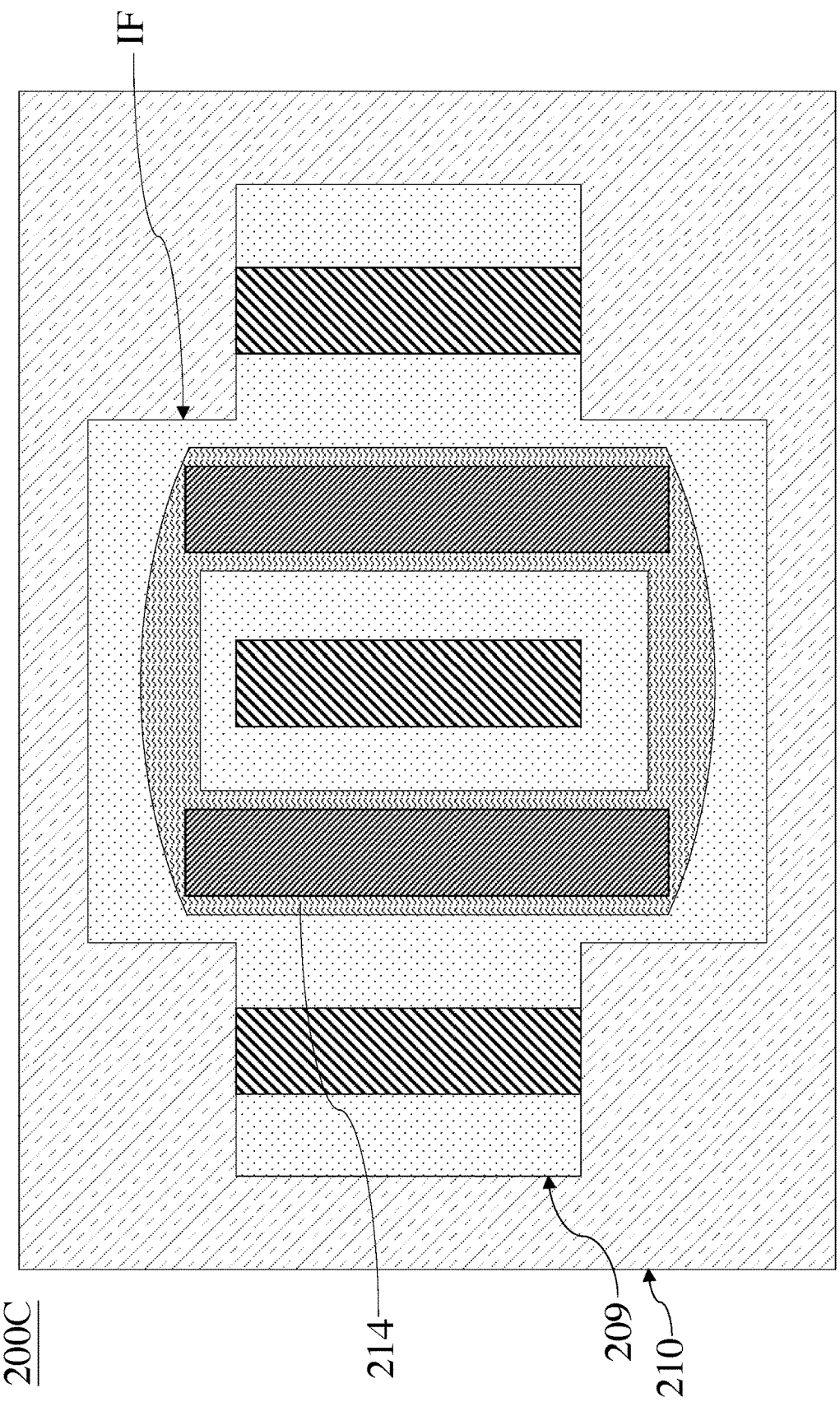
FIG. 15 is a top view of a semiconductor device according to some embodiments of the present disclosure.

FIG. 15 is a top view of a semiconductor device 200C according to some embodiments of the present disclosure. In the present embodiment, as shown in the exemplary illustration of FIG. 15, the doped nitride-based semiconductor layer 214 has a curved boundary. The curved boundary of the doped nitride-based semiconductor layer 214 is spaced apart from the interface IF between the active portion 209 and the electrically isolating portion 210.

Figure 16:
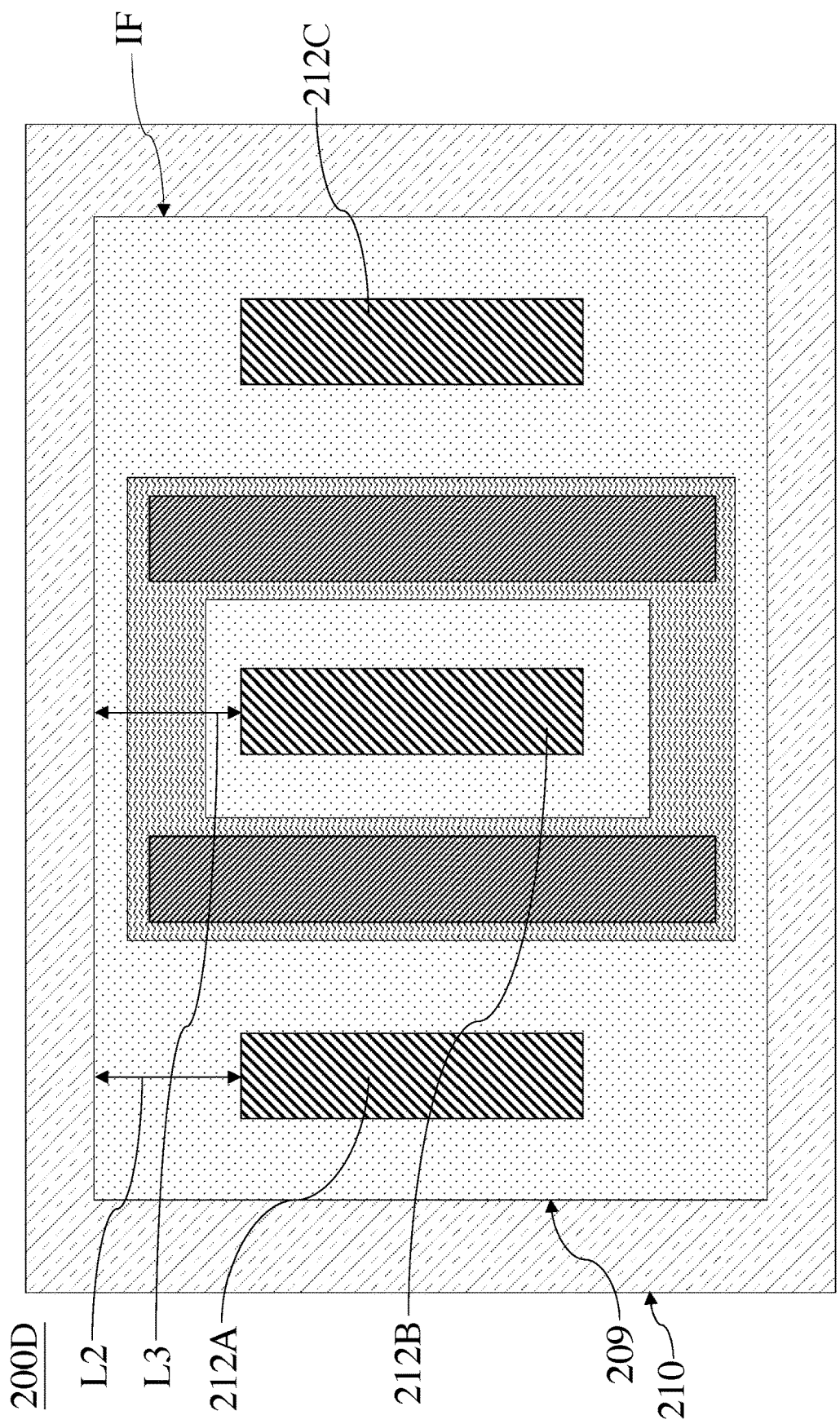
FIG. 16 is a top view of a semiconductor device according to some embodiments of the present disclosure.

FIG. 16 is a top view of a semiconductor device 200D according to some embodiments of the present disclosure. In the present embodiment, as shown in the exemplary illustration of FIG. 16, a distance L2 from an end surface of the electrode 212A or 212C to the interface IF between the active portion 209 and the electrically isolating portion 210 is substantially the same as a distance L3 from an end surface of the electrode 212B to the interface IF.

As described above, the doped nitride-based semiconductor layer can be formed with different shapes. With the layout of the active portion and the electrically isolating portion, the side surface/sidewall of the doped nitride-based semiconductor layer can avoid the damage by ions during the ion implantation process, so as to have the operation of the semiconductor device stable, which results from reducing the possible leakage current. Moreover, the structure for it is flexible, which means the solution for solving the damage on the side surface/sidewall of the doped nitride-based semiconductor layer provided by the present disclosure can adopt different process conditions.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A high electron mobility transistor semiconductor device comprising:
   a first nitride-based semiconductor layer;
   a second nitride-based semiconductor layer disposed on the first nitride-based semiconductor layer and having a bandgap greater than a bandgap of the first nitride-based semiconductor layer, wherein the first and second nitride-based semiconductor layers collectively have a continuous active portion and an electrically isolating portion that is non-semi-conducting and surrounds the continuous active portion to form an interface;
   a pair of first electrodes disposed over the second nitride-based semiconductor layer;
   a pair of doped nitride-based semiconductor layers disposed over the second nitride-based semiconductor layer and between the first electrodes, wherein the doped nitride-based semiconductor layers are separated from each other;
   a second electrode disposed over the second nitride-based semiconductor layer and between the doped nitride-based semiconductor layers, wherein each of the doped nitride-based semiconductor layers has a first side surface facing away from the second electrode and spaced apart from the interface; and
   a pair of gate electrodes disposed over the doped nitride-based semiconductor layers, respectively;
   wherein top-view orthographic projections of the pair of first electrodes, the pair of doped nitride-based semiconductor layers, the second electrode and the pair of gate electrodes on a top surface of the second nitride-based semiconductor layer are within the continuous active portion,
   wherein the doped nitride-based semiconductor layers have second side surfaces facing each other, and the second side surfaces are closer to the interface than the first side surfaces.

2. The high electron mobility transistor semiconductor device of claim 1, wherein the electrically isolating portion has at least one pair of concaves to receive the continuous active portion, and the doped nitride-based semiconductor layers extend to partially cover the received continuous active portion.

3. The high electron mobility transistor semiconductor device of claim 2, wherein the first side surface is spaced apart from the interface by a first vertical spacing and a second vertical spacing greater than the first vertical spacing.

4. The high electron mobility transistor semiconductor device of claim 1, wherein a part of the interface extends from one of the second side surfaces to another one of the second side surfaces.

5. The high electron mobility transistor semiconductor device of claim 1, wherein the first and second electrodes viewed along a direction normal to the second nitride-based semiconductor layer are first strips extending along a first direction and arranged along a second direction different than the first direction.

6. The high electron mobility transistor semiconductor device of claim 5, wherein the doped nitride-based semiconductor layers viewed along the direction normal to the second nitride-based semiconductor layer are second strips extending along the first direction and arranged along the second direction, and the second strips are longer than the first strips.

7. The high electron mobility transistor semiconductor device of claim 1, wherein the second electrode viewed along a direction normal to the second nitride-based semiconductor layer is collectively enclosed by the interface and boundaries of the doped nitride-based semiconductor layers.

8. The high electron mobility transistor semiconductor device of claim 1, wherein the electrically isolating portion is doped with nitrogen ion, fluorine ion, oxygen ion, argon atom, aluminum atom, or combinations thereof.

9. The high electron mobility transistor semiconductor device of claim 1, wherein the second side surfaces partially align with the interface, so that the second side surfaces are coplanar with the interface.

10. The high electron mobility transistor semiconductor device of claim 1, wherein each of the doped nitride-based semiconductor layers further has a pair of end surfaces aligning with the interface, so that the pair of end surfaces are coplanar with the interface.

11. The high electron mobility transistor semiconductor device of claim 1, further comprising:
    a plurality of protection layers disposed over the second nitride-based semiconductor layer and the doped nitride-based semiconductor layers, wherein some portions of the first side surfaces are covered with the protection layers.

12. The high electron mobility transistor semiconductor device of claim 11, wherein each of the protection layers extends from the active portion to a top surface of the corresponding doped nitride-based semiconductor layer.

13. The high electron mobility transistor semiconductor device of claim 11, wherein the protection layers have boundaries aligning with the interface, so that the boundaries are coplanar with the interface.

14. The high electron mobility transistor semiconductor device of claim 11, wherein each of the protection layers is located between the doped nitride-based semiconductor layers and the gate electrodes.

15. A manufacturing method of a high electron mobility transistor semiconductor device, comprising:
    forming a first nitride-based semiconductor layer;
    forming a second nitride-based semiconductor layer on the first nitride-based semiconductor layer;

forming a plurality of first conductive strips over the second nitride-based semiconductor layer;

forming a pair of doped nitride-based semiconductor strips over the second nitride-based semiconductor layer such that at least one of the first conductive strips is between the doped nitride-based semiconductor strips;

forming a mask layer over the second nitride-based semiconductor layer, the first conductive strips, and the doped nitride-based semiconductor strips such that each of the doped nitride-based semiconductor strips has a side surface entirely covered with the mask layer, wherein a region of the second nitride-based semiconductor layer is exposed from the mask layer; and performing an ion implantation process on the first and second nitride-based semiconductor layers such that the first and second nitride-based semiconductor layers collectively have an electrically isolating portion directly under the exposed region of the second nitride-based semiconductor layer and a continuous active portion under the mask layer to form an interface between the electrically isolating portion and the continuous active portion, wherein top-view orthographic projections of the first conductive strips and the doped nitride-based semiconductor strips on the second nitride-based semiconductor layer are within the continuous active portion, wherein the doped nitride-based semiconductor strips have first side surfaces facing away from the at least one of the first conductive strips between the doped nitride-based semiconductor strips and have second side surfaces facing each other, wherein the second side surfaces are closer to the interface than the first side surfaces.

16. The manufacturing method of claim 15, wherein forming the doped nitride-based semiconductor strips comprises patterning a blanket doped nitride-based semiconductor layer.

17. The manufacturing method of claim 15, wherein forming the mask layer is performed such that the mask layer has a boundary partially aligning with a boundary of the doped nitride-based semiconductor strips.

18. The manufacturing method of claim 15, further comprising:

removing the mask layer; and forming a pair of second conductive strips over the doped nitride-based semiconductor layer strips.

19. The manufacturing method of claim 15, further comprising:

forming at least two protection layers to cover portions of the doped nitride-based semiconductor strips, respectively, prior to forming the mask layer.

* * * * *